(12) United States Patent
Tomita et al.

(10) Patent No.: US 7,378,332 B2
(45) Date of Patent: May 27, 2008

(54) LAMINATED SUBSTRATE, METHOD OF MANUFACTURING THE SUBSTRATE, AND WAFER OUTER PERIPHERY PRESSING JIGS USED FOR THE METHOD

(75) Inventors: Shinichi Tomita, Tokyo (JP); Kouji Yoshimaru, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 323 days.

(21) Appl. No.: 10/499,028

(22) PCT Filed: May 2, 2003

(86) PCT No.: PCT/JP03/05652

§ 371 (c)(1), (2), (4) Date: Jun. 17, 2004

(87) PCT Pub. No.: WO03/098695

PCT Pub. Date: Nov. 27, 2003

(65) Prior Publication Data
US 2005/0014347 A1  Jan. 20, 2005

(30) Foreign Application Priority Data
May 20, 2002  (JP) .............................. 2002-145327

(51) Int. Cl.
*H01L 21/30* (2006.01)
(52) U.S. Cl. ...................... 438/459; 438/455
(58) Field of Classification Search .............. 438/455, 438/459
See application file for complete search history.

(56) References Cited

U.S. PATENT DOCUMENTS 5,152,857 A * 10/1992 Ito et al. ..................... 156/153

(Continued)

FOREIGN PATENT DOCUMENTS

EP  0 935 280 A1  8/1999

(Continued)

OTHER PUBLICATIONS

Mitani, Kiyoshi, *Science of Silicon, Surface Science Technology Series* vol. 3, UCS Semiconductor Substrate Technology Research Association, Realize Inc., pp. 465 and 467, Jun. 28, 1996.

*Primary Examiner*—Douglas M. Menz
(74) *Attorney, Agent, or Firm*—Kubovcik & Kubovcik

(57) ABSTRACT

Provided are a bonding substrate whose defective bonding portion in a peripheral region of an active layer has been removed by a polishing applied thereto after a surface grinding, a manufacturing method of the same substrate and wafer periphery pressing jigs. After the surface grinding, a periphery removing polishing is applied from an active layer wafer side of a bonding wafer so that a peripheral region of the active layer may be removed and a central region thereof may be left un-removed. Consequently, a periphery grinding and a periphery etching according to the prior art can be eliminated. Furthermore, an etch pit on a circumferential face of a wafer which could be caused by the periphery etching and a contamination or a scratching in an SOI layer which could be caused by a silicon oxide film left unground-off can be prevented, thereby achieving high yield and low cost.

9 Claims, 14 Drawing Sheets

U.S. PATENT DOCUMENTS

| | | | |
|---|---|---|---|
| 6,174,222 B1 | 1/2001 | Sato et al. | 451/44 |
| 2001/0029150 A1 | 10/2001 | Kimura et al. | 451/41 |

FOREIGN PATENT DOCUMENTS

| | | |
|---|---|---|
| EP | 1 189 266 A1 | 3/2002 |
| JP | 2-181469 A | 7/1990 |
| JP | 5-109678 A | 4/1993 |
| JP | 5-226305 A | 9/1993 |
| JP | 5-235007 | 9/1993 |
| JP | 2003-142439 A | 5/2003 |
| WO | 00/63954 | 10/2000 |

\* cited by examiner

LAMINATED SUBSTRATE, METHOD OF MANUFACTURING THE SUBSTRATE, AND WAFER OUTER PERIPHERY PRESSING JIGS USED FOR THE METHOD

FIELD OF THE INVENTION

The present invention relates to a bonding substrate, a method for manufacturing the same and a wafer periphery pressing jig used in the same method, and in more specific, to a technology for manufacturing a bonding substrate, in which, for example, a removal processing of a defective bonding portion in a peripheral region of an active layer is carried out in a polishing process after a surface grinding.

DESCRIPTION OF THE PRIOR ART

One known type of the bonding substrate comprising two pieces of silicon wafers that have been bonded in one on the other includes a bonding SOI (Silicon on Insulator) substrate. This represents the bonding SOI substrate comprising an oxide film (silicon oxide film) of some μm thick implanted between an SOI layer (active layer) on a surface of which a device is to be formed and a supporting substrate wafer which supports the SOI layer from a back side thereof.

One method has been known for manufacturing this type of bonding SOI substrate, in which during a periphery grinding process for grinding a peripheral region of an active layer wafer, the wafer peripheral region is not fully ground off but some portion thereof is left, and then this left portion is removed by an alkaline etchant, which is followed by a surface grinding and a surface polishing processes applied in sequence to said active layer whose peripheral region has been ground.

A conventional manufacturing process of the bonding SOI substrate will now be described in sequence with reference to FIGS. 23 to 27.

First of all, a single crystalline silicon ingot that has been pulled up by the Czochralski method is sliced and polished to thereby prepare two pieces of mirror finished silicon wafers (CZ wafers) 101 and 102 (FIG. 23(a)). One of these two wafers which is to be used as an active layer wafer 101 comprises an insulating silicon oxide film 101a formed entirely over an exposed surface thereof through a thermal oxidation processing by using a thermal oxidation furnace.

Subsequently, the active layer wafer 101 and the supporting substrate wafer 102 are bonded in one on the other at an ordinary temperature to thereby fabricate a bonding wafer 103. Through this process, an implanted silicon oxide film 101b may be provided between said two wafers 101 and 102. After that, a bonding thermal processing at a temperature equal to or higher than 800° C. is applied to the bonding wafer 103 under an oxidizing atmosphere (FIG. 23(b)). Thus, the silicon oxide film 103a is formed entirely over the exposed surface of the bonding wafer 103. At that time, the active layer wafer 101 has been covered in advance with the silicon oxide film 101a. Owing to this, the oxide film may grow further to be thicker with the aid of the heat from the bonding thermal processing. For convenience, the silicon oxide films 101a and 103a are indicated by different colors in FIG. 23 (similar in FIG. 1).

In the next step, a peripheral region of the active layer wafer 101 is ground of f in order to remove a defective bonding regions resultant from the peripheral shapes of the beveled two wafers 101 and 102 (FIG. 23(c)). If there were any defective bonding regions left, those regions would be stripped off and dispersed away in the subsequent cleaning and/or polishing processes, which could cause a contamination of the surface of the SOI layer (active layer) with said dispersed material adhering on the surface or a damage on the surface of the SOI layer during the subsequent wafer processing due to this adherent dispersed material. This periphery grinding may be ceased at a level not to reach a bonding interface. Consequently, some volume of material 101c is left un-ground in the peripheral region of the active layer wafer 101.

Subsequently, the portion left un-ground-off 101c is removed by the alkaline etching (FIG. 23(d)). Specifically, the peripheral region of the bonding wafer 103 comes into contact with an alkaline etchant such as KOH to cause the portion left un-ground-off 101c to be dissolved. Thus, the peripheral region of the surface defined in the bonding surface side of the supporting substrate wafer 102 is exposed. Hereinafter, this exposed portion is referred to as a terraced portion.

Subsequently, the surface of the active layer wafer 101 is ground and further polished into a mirror surface, to thereby fabricate a bonding SOI substrate comprising a thin SOI layer 101A supported by the supporting substrate wafer 102 from a back surface side thereof (FIG. 23(e)).

However, the conventional manufacturing method of the bonding SOI substrate according to the prior art is associated with the drawbacks as will be described below.

(1) To fabricate the SOI layer 101A according to the prior art, such a series of complicated processes has been employed, in which a peripheral region of the active layer wafer 101 is partially ground off with some portion thereof left un-ground-off, subsequently this left portion 101c is removed by the periphery etching, and then the surface grinding and polishing processes are applied to the active layer wafer 101. This has increased the number of manufacturing processes of the bonding substrate, leading to a longer manufacturing time to be required.

(2) In said step of bonding thermal processing, the bonding wafer 103 is inserted to be mounted in a wafer mounting recess of a wafer boat, though not shown, and then the wafer boat is introduced in a thermal oxidation furnace to provide the thermal processing. At that time, since the peripheral end face of the supporting substrate wafer 102 comes into contact with an inner wall of the wafer mounting recess of the wafer boat, there could occur a scratching and an insufficient growth of the oxidation film in the peripheral end face of the supporting substrate wafer 102. If the periphery etching is applied to the portion left un-ground-off 101c with such defection formed thereon, the portions of said scratching and said insufficient growth of the oxide film are selectively etched more as compared to other portions, resulting in an etch pit "a" shown in FIG. 24 to appear in the peripheral end face of the supporting substrate wafer 102.

(3) Also during the step of periphery grinding of the active layer wafer 101, there is a fear that a peripheral surface of the supporting substrate wafer 102 could be scratched and/or the separation of adhesion could be induced locally in the peripheral regions of the two wafers 101 and 102, which could lead to the selective etching in these portions resulting in an etch pit "b" shown in FIG. 25 to be developed.

(4) In said step of alkaline etching, the silicon oxide film 101a, 103a are hardly etched. Owing to this, after the surface grinding and surface polishing processes of the active layer wafer 101, the mustache-shaped silicon oxide film 101a, 103a portion "c" is left un-ground-off in the terraced portion of the supporting substrate wafer 102 (FIG. 26), which is associated with a fear that said portion could be stripped off and dispersed to adhere onto the surface of the SOI layer 101A to cause the contamination therein and that the adhering material could cause a damage in the surface of the SOI layer 101A during the subsequent wafer processing steps.

(5) In the peripheral edge face of the SOI layer 101A, a crystal orientation is not uniform in the areas other than the vicinity of the locations defined by the multiple of 90 degrees (i.e., locations defined by 90 degrees, 180 degrees and 270 degrees) originated in an orientation flat or a notch along the circumferential direction. For example, according to the SOI layer having its device forming surface defined as a (100) face, the portions defined by the multiple of 90 degrees with respect to the orientation flat or the notch have the crystal orientation of [011], but other portions have uneven crystal orientation. Owing to this, when the anisotropic etching using the alkaline etchant such as KOH is applied to the peripheral region or the portion left unground-off 101c, an indent "d" (i.e., sawtooth-like notches) as shown in FIG. 27 is induced in the peripheral edge face of the SOI layer 101A specifically in the region having the uneven crystal orientation.

(6) For example, according to the SOI substrate fabricated by the smart cut method, it is possible to make the SOI layer in the form having a notch. However, in said bonding SOI substrate having the surface of SOI layer 101A to be finished by polishing, the terrace formation is achieved by the periphery grinding, wherein it is difficult to provide the periphery grinding along the notch simply by one-time grinding. Accordingly, the SOI layer having the orientation flat has been typically employed. Consequently, the area available for forming the device is restricted to be smaller as compared to the case of SOI layer having the notch.

In an actual wafer manufacturing, as a counter measure to solve the above-described problems (2)-(6), further complicated processes have been added to ensure the quality of the bonding SOI substrates. Disadvantageously, this has produced an additional factor to increase a manufacturing cost.

(7) Sometimes, the bonding wafer is provided with a laser mark carved in the orientation flat portion or the notch portion of the supporting substrate wafer in order to identify the wafer. In more specific, those previously designated marks, such as a bar code, a numeric figure, a symbol and a pattern, may be indicated in the terraced portion exposed to the outside. The well-known typical kinds of laser mark include a soft laser mark having a carving depth in a range of 0.1-5 μm and a hard laser mark having a carving depth in a range of 5-1000 μm. In the device process, the soft laser mark is used. If the soft laser mark is printed on a surface of the SOI layer of the SOI wafer having a thickness of the SOI layer equal to or less than 5 μm, the laser light could reach to the implanted oxide film to generate dust particles and thereby to contaminate the surface of the active layer, leading to the deterioration of yield of device.

Further, the structure of the bonding SOI is more advantageous to cope with the problem of a crystal defect in an Si-SiO$_2$ interface and a thin-film Si layer as compared to the other SOI structures including SIMOX and the like. However, the CZ wafer to be prepared as a material of the wafer contains a lot of COP and/or BMD (Bulk Micro Defect), which may deteriorate a device characteristic.

In this concern, one prior art aiming for solving this problem has been known as disclosed in the Japanese Patent Laid-open Publication No. Hei 5-211616. This has disclosed the art, in which a thermal processing at a high temperature is applied to an active layer wafer before being bonded or a bonding SOI substrate after having been bonded, in the reducing atmosphere or in the inactive atmosphere to thereby remove any oxygen present on the surface of the SOI layer to increase the quality of the crystal.

(8) However, when the thermal processing at the high temperature is applied to the active layer wafer before being bonded, in the reducing atmosphere or in the inactive atmosphere, the surface of the SOI layer that has been obtained by decreasing the thickness of the active layer wafer may define an exposed surface. This causes the crystal defects to be exposed in the surface of the SOI layer, which may have been generated during the growing of the single silicon ingot or during the oxide film formation and the bonding thermal processing. Therefore, even if said thermal processing at the high temperature is applied to the active layer wafer before being bonded, in practice, the defects are still existing on the surface of the SOI layer to fail in providing the counter measure to improve the quality of crystal.

(9) When the thermal processing in the reducing atmosphere or in the inactive atmosphere is to be applied to the active layer wafer after having been bonded, another thermal processing should be applied separately from the bonding thermal processing, which inevitably results in an increase in the manufacturing cost.

In the light of the problematic circumstances described above, the inventors have devoted themselves in the enthusiastic research and made the present invention from the fining that if the defective bonding portion in the peripheral region of the active layer wafer is removed exclusively by the surface grinding and the surface polishing instead of the periphery grinding and the periphery etching of the active layer wafer which has been practiced in the prior art, the above-described problems (1)-(6) can be resolved.

An object of the present invention is to provide an improved bonding substrate and a manufacturing method thereof, which can help reduce the number of manufacturing processes and the length of manufacturing time of the bonding wafers, and also enhance a production efficiency of non-defective units of the bonding substrate, while enabling a low cost production of the bonding substrates, and further allow the active layer having a notch to be manufactured.

Another object of the present invention is to provide a wafer periphery pressing jig allowing for a periphery removing polishing to be applied to the wafer by using an existing polishing apparatus.

Further, the inventors has made the present invention from the finding that if the width of the portion to which the laser marking is applied in the terraced portion of the supporting substrate wafer, for example, the width of the orientation flat portion or of the notch portion, is extended, the generation of dust particles from the active layer due to the irradiation of the laser can be suppressed and thereby the above-described problem (7) can be resolved.

That is, another object of the present invention is to provide a bonding substrate, in which even if a laser marking is applied to a part of a peripheral region of the supporting substrate wafer, the dust particles are hardly generated from the active layer, as well as a manufacturing method thereof and a pressing jig used in removing a part of wafer, which is employed in the same method.

Further, the inventors have found that the bonding wafer can be fabricated without causing any peripheral region of the wafer to be stripped even without applying the thermal processing for enhancing the bonding strength after bonding the active layer wafer and the supporting substrate wafer under a room temperature, by applying the surface grinding to the active layer wafer and also applying the periphery removing polishing to the active layer for removing the peripheral region to leave the central region thereof. Furthermore, the inventors has made the present invention from the further finding that following to the above-mentioned processes, if the thermal processing is applied in the reducing atmosphere or in the inactive atmosphere after the central region of the active layer has been polished, then the crystal defects would be no more present in the surface of the active layer, thus resolving the above-described problems (8) and (9).

That is, an object of the present invention is to provide a bonding substrate containing no crystal defect in the surface of the active layer and a method for manufacturing the same yet with a lower cost.

DISCLOSURE OF THE INVENTION

A first invention provides a bonding substrate comprising an active layer and a supporting substrate wafer for supporting said active layer from a back surface side thereof, said active layer and said supporting substrate wafer being bonded with each other, wherein a peripheral surface of said active layer assumes a polished inclined plane defined from a peripheral edge of a top surface of said active layer to a peripheral edge of a bonding interface of said supporting substrate wafer whose defective portions having been removed or defined from the peripheral edge of the top surface of said active layer to the peripheral edge of said supporting substrate wafer.

As for the bonding substrate, for example, a bonding SOI substrate may be employed. In addition, a substrate comprising the active layer bonded directly with the supporting substrate wafer may be employed. The active layer may include, for example, an SOI layer of the bonding SOI substrate. In this case, the oxide film resides below the active layer and the exposed surface in the peripheral edge of the oxide film also defines the polished inclined plane. Further, the supporting substrate wafer may include, for example, a silicon wafer.

Herein, the above phrase that a peripheral surface of said active layer assumes a polished inclined plane defined from a peripheral edge of a top surface of said active layer to a peripheral edge of a bonding interface of said supporting substrate wafer whose defective portions having been removed means that the peripheral surface of the active layer defines a polished surface getting widen toward the end. The phrase of getting widen toward the end means a geometry having a linear (tapered) cross section or having an arcuate cross section. In this concern, the geometry having the arcuate cross section represents a geometry characterized in a central region thereof protruding outwardly as compared to the opposite ends thereof in sectional view.

According to the first invention, the periphery removing polishing is applied to the active layer wafer of the bonding wafer in the region defined from the peripheral edge of the top surface of the active layer to the peripheral edge of the bonding interface of the supporting substrate wafer whose defective portions having been removed or defined from the peripheral edge of the top surface of the active layer to the peripheral edge of the supporting substrate wafer, with the central region of the active layer left un-removed. Advantageously, this may eliminate the periphery grinding process for the active layer wafer as well as the periphery etching process for the active layer, which have been required in the prior art. As a result, the number of manufacturing processes of the bonding substrate may be decreased and in conjunction with this, a time required to manufacture the bonding substrate may also be reduced.

Further, applying the periphery removing polishing may help prevent an etch pit from being developed in the peripheral surface of the supporting substrate wafer, which could be caused by the periphery etching of the active layer, and it may also help prevent, in the bonding substrate represented by the bonding SOI substrate, a contamination and/or a scratching from being produced in the active layer, which could be caused by a mustache-shaped silicon oxide film portion left un-ground-off in the peripheral region of the active layer and then stripped and dispersed therefrom after the periphery etching process. This may enhance a production efficiency of non-defective units of the bonding substrate. As a result, a manufacturing cost of the bonding substrate may be reduced. Further, such a bonding substrate containing an active layer with a notch formed therein may be fabricated in a simple manner, which has been considered difficult to fabricate in the conventional method.

Furthermore, since the peripheral region of the active layer is removed not by the alkaline etching as practiced in the prior art but by the polishing with the polishing cloth (periphery removing polishing), an indent resultant from an anisotropic etching would not be generated in the peripheral edge surface of the active layer even in a region other than those defined by multiples of 90 degrees in the circumferential direction starting from the location of the orientation flat or the notch taken as a reference, or in the region having uneven crystal orientation. Owing to this, the peripheral edge surface of the active layer can be formed into smooth surface over an entire circumference thereof.

Thus obtained bonding substrate is characterized in the polished inclined surface defined from the peripheral edge of the top surface of the active layer to the peripheral edge of the bonding interface of the supporting substrate wafer whose defective portions having been removed or the polished inclined surface defined from the peripheral edge of the top surface of the active layer to the peripheral edge of the supporting substrate wafer.

A second invention provides a bonding substrate in which said top surface of said active layer contains no crystal defect existing therein.

The terms of crystal defect used therein refers, for example, to a crystal defect that has been developed during growing of a single-crystal silicon ingot and a crystal defect that has been developed during forming of the oxide film or during the bonding thermal processing. Specifically, it includes COP (Crystal Originated Particle), BMD, OSF (Oxidation Induced Stacking Fault) and so on.

The phrase, no crystal defect existing, used herein refers to a condition where the crystal defects having the size no smaller than 0.1 µm in diameter exists in the surface of the active layer only by an amount equal to or less than 10 pieces/cm$^2$.

The process used to create the condition with no crystal defect existing in the surface of the active layer may not be limited. By way of example, the thermal processing after the active layer having been formed on the surface of the supporting substrate wafer defined in the bonding side may be employed.

According to the second invention, since there is no crystal defect existing in the surface of the active layer, the electrical characteristics of a device formed in the surface of the active layer may be enhanced.

A third invention provides a bonding substrate in which a width of said polished inclined plane varies depending on the part in the circumferential direction of the wafer.

The phrase of width of the inclined plane used herein refers to a length of the inclined plane in the direction orthogonal to a tangential line of the peripheral edge of the active layer. The phrase, a width of the inclined plane varies depending on the part in the circumferential direction of the wafer, means that the inclined plane contains wider parts and narrower parts along the circumferential direction of the wafer. Since the active layer is thinner, a major part of the inclined plane is composed of the peripheral region of the supporting substrate wafer defined in the bonding surface side (i.e., terraced portion). Among these portions, the wider parts may be used, for example, as a making region to which the laser marking is applied. The laser marking may employ soft laser marking. A location and a range in which the wider part is to be formed in the circumferential direction of the wafer may not be limited. By way of example, the portion of the orientation flat or the notch may be employed as the wider part.

The width of the narrower part may be in a range of 0.5 to 4 mm, preferably in a range of 0.5 to 1.5 mm. With the width smaller than 0.5 mm, there will be induced such a disadvantage that some areas will be left un-bonded. Further, the width greater than 4 mm may bring about another disadvantage that the device area will be reduced, leading to the bad device yield.

The width of the wider part may be in a range of 3 to 5 mm, preferably in a range of 3 to 4 mm. With the width smaller than 3 mm, there will be induced such a disadvantage that the surface of the SOI layer could be contaminated by the dust particles. Further, the width greater than 5 mm will cause another disadvantage to reduce the device area, leading to a worse device yield.

According to the third invention, the polishing is carried out in such a manner that the width of the inclined plane varies depending on the part in the circumferential direction of the wafer, and thereby in the wider parts of the inclined plane, for example, in the portion of the notch or the orientation flat, a part of the peripheral region of the active layer may be removed with a larger extent than in the other parts, and accordingly, a wider terraced portion may appear in the peripheral region of the supporting substrate wafer. If the laser marking is applied to such a wider terraced portion, for example, the effect of the irradiated laser would not easily reach the active layer. As a result, the generation of the dust particles in the active layer during the laser marking can be inhibited.

A fourth invention provides a bonding substrate in which a wider part in said inclined plane defines a notch portion or an orientation flat portion.

The wider part in the inclined plane may be either one of the notch portion or the orientation flat portion.

A fifth invention provides a bonding substrate in which said bonding substrate is a bonding SOI substrate including an oxide film implanted between said active layer and said supporting substrate wafer.

In bonding SOI substrate, the layer to be covered by the oxide film may be either one of the active layer wafer prepared as a base material for the active layer or the supporting substrate wafer. Alternatively, it may be both of the active layer wafer and the supporting substrate wafer. The process used to form the oxide film may not be limited. By way of example, the dry oxidation and the wet oxidation may be employed. Further, an $n^+$ layer and/or a SiGe layer may be formed on the bonding surface.

A sixth invention provides a manufacturing method of a bonding substrate, comprising: a bonding step for bonding an active layer wafer and a supporting substrate wafer with one on the other; a thermal processing step for enhancing a bonding strength of said bonding wafer fabricated in said bonding step; a surface grinding step for applying a surface grinding to the active layer wafer side of said bonding wafer to decrease a thickness of said active layer wafer so as to make it operative as an active layer; and a periphery removing polishing step for applying polishing to said active layer from said surface grinding side so as to remove a defective bonding portion in a peripheral region and to leave a central region un-removed.

The bonding step for bonding the active layer wafer and the supporting substrate wafer may be carried out by, for example, stacking two wafers in one on the other in an ordinary temperature and then applying a bonding thermal processing to the stacked wafers. The temperature used in the bonding thermal processing may be 800° C. or higher, in one example, 1100° C. Time period of the bonding thermal processing may be two hours, for example. An atmospheric gas used within a thermal oxidation furnace may include oxygen.

Further, when the surface grinding is applied to the active layer wafer, in one example, a surface grinding wheel is used for the grinding. As for the condition of the surface grinding, for example, a resinoid grinding wheel in a grade of #360 to #2000 may be used so as to apply the surface grinding until the thickness of the remaining active layer reaches the range of 10 to 60 µm.

The thickness of the active layer may not be limited. By way of example, the thickness of the relatively thicker active layer may be in a range of 1 to 200 µm, while the thickness of the relatively thinner active layer may be in a range of 0.1 to 1.0 µm.

The periphery removing polishing process may be achieved by, for example, the surface polishing characterized in that a higher polishing rate is applied to the peripheral region of the active layer than that applied to the central region thereof; the surface polishing characterized in that an increased amount of a polishing agent is supplied to the peripheral region of the active layer as compared to that supplied to the central region thereof; the surface polishing characterized in that an increased polishing pressure is applied to the peripheral region of the active layer as compared to that applied to the central region thereof; the surface polishing characterized in that a more aggressive polishing material is used for a portion of the polishing cloth to be pressed against the peripheral region of the active layer as compared to that used for a portion of the polishing cloth to be pressed against the central region of the active layer; or the surface polishing characterized in that a temperature of a portion of the polishing cloth to be pressed against the peripheral region of the active layer is controlled to be higher than that of a portion of the polishing cloth to be pressed against the central region of the active layer.

In either case of polishing, for example, the bonding wafer, which has been processed with the surface grinding, is mounted on a polishing head of a polishing apparatus and then a ground surface of the active layer wafer is pressed against the polishing cloth attached to a polishing platen while supplying an abrasive agent, to thereby carry out the polishing process.

The polishing apparatus is not limited to any specific ones. A single wafer processing type of polishing apparatus or a batch processing type of polishing apparatus may be used. Further, a single side polishing apparatus of wax type or that of waxless type may be used.

The type of polishing cloth is not limited to any specific ones. In one example, a porous non-woven fabric type of polishing cloth made of polyester felt impregnated with polyurethane may be used. In addition, it may include an expandable urethane type of polishing cloth made by slicing a block of expanded urethane. Further, a suede type of polishing cloth may be used, which is made of expandable polyurethane stacked in layer on a surface of base material made of polyester felt impregnated with polyurethane, from which the top layer of the polyurethane is removed to left openings formed in the expanding layer. Furthermore, ceramic or glass may be used.

Said polishing agent contains loose abrasive grains (polishing abrasive grains). The peripheral region of the ground surface of the active layer wafer is removed by polished through a grinding operation of the loose abrasive grains, which are fine grains, by pressing the ground surface of the active layer wafer with a reduced thickness against an effective polishing surface of the revolving polishing cloth while supplying the polishing agent.

According to the sixth invention, the surface grinding is applied directly to the active layer wafer side of the bonding wafer after the bonding thermal processing, so as to reduce the thickness of the active layer wafer, and then the periphery removing polishing is applied to the active layer wafer so as to remove the defective portion to make it operable as the active layer.

Employing such a periphery removing polishing process as described above allows to eliminate the periphery grinding process of the active layer wafer as well as the periphery etching process of the active layer, which have been required in the prior art method. As a result, the number of manufacturing processes of the bonding substrate can be reduced, and in conjunction with this, the manufacturing time of the bonding substrate can be also reduced.

Further, applying the periphery removing polishing may help prevent an etch pit from being developed in the peripheral surface of the supporting substrate wafer, which could be caused by the periphery etching of the active layer, and it may also prevent, in the bonding substrate represented by the bonding SOI substrate, a contamination and/or a scratching from being produced in the active layer, which could be caused by a mustache-shaped silicon oxide film portion left un-ground-off. This may enhance a production efficiency of non-defective units of the bonding substrate. As a result, a manufacturing cost of the bonding substrate may be reduced. Further, such a bonding substrate containing an active layer with a notch formed therein may be fabricated in a simple manner.

Furthermore, since the peripheral region of the active layer is removed not by the alkaline etching but by the polishing, an indent resultant from anisotropic etching would not be generated in the peripheral edge surface of the active layer even in a region other than those defined by multiples of 90 degrees in the circumferential direction starting from the location of the orientation flat or the notch taken as a reference. Owing to this, the peripheral edge surface of the active layer can be formed into smooth surface over an entire circumference thereof.

A seventh invention provides a manufacturing method of a bonding substrate, further comprising, instead of said thermal processing step after said bonding step: after said periphery removing polishing step, a central polishing step for polishing a central region of said active layer; and after said central polishing step, a thermal processing step for applying a thermal processing in a reducing atmosphere or in an inactive atmosphere to said bonding substrate thereby to enhance the bonding strength of said bonding wafer while removing a crystal defect from the surface of said active layer.

The amount of the active layer to be polished off from the central region thereof in said central polishing step may be, for example, in a range of 5 to 10 µm, preferably 7 µm. The amount smaller than 5 µm may cause such a disadvantage that a damage from the surface grinding will left un-removed. Further, the amount greater than 10 µm will cause another disadvantage to require a longer polishing time.

The atmosphere within the furnace during the thermal processing may be a reducing or an inactive gas atmosphere.

The reducing atmosphere may be formed by using a reducing gas, such as $H_2$, for example.

The inactive atmosphere may be formed by using an inactive gas, such as He, Ne, Ar, Kr, and Xe, for example. Further, a mixture of the reducing gas and the inactive gas, for example, a mixed gas composed of $H_2$:Ar=5:1, may be employed.

The temperature used in the thermal processing may be 1000° C. or higher, preferably in a range of 1150 to 1250° C. The temperature lower than 1000° C. may cause such a disadvantage that the crystal defect would not shrink sufficiently. The temperature higher than 1250° C. may cause another disadvantage that a slip or a metallic contamination could occur in the active layer.

Time period of the thermal processing may be one to three hours, for example.

According to a seventh invention, since the thermal processing for enhancing the bonding strength between the active layer and the supporting substrate wafer is applied in the reducing atmosphere or in the inactive atmosphere after the central region of the active wafer having been polished, the crystal defect can be removed from the surface of the active layer even without applying the thermal processing under these atmosphere separately from the bonding thermal processing.

An eighth invention provides a manufacturing method of a bonding substrate by using a smart cut method or an ELTRAN method or a SiGen method, said manufacturing method comprising: a bonding step for bonding an active layer wafer and a supporting substrate wafer with one on the other; an active layer wafer removing step after said bonding step, for partially removing the active layer wafer with some portion thereof in the bonding side left on said supporting substrate wafer so as to form an active layer on one surface of said supporting substrate wafer; and a periphery removing polishing step for applying polishing to said active layer from said removed surface side thereof so as to remove a peripheral region of said active layer and to leave a central region thereof un-removed.

The smart cut method is defined by such process in which first of all, light elements are ion-implanted from one of the surfaces of the active layer wafer having an oxide film formed over an entire area of an exposed surface thereof, and then the supporting substrate wafer is bonded over the ion-implanted surface, and subsequently, the thermal processing is applied to said bonded wafer to enhance its bonding strength, while at the same time, the bonding wafer is divided into two parts in its thickness direction along a portion into which the light elements have been ion-implanted so as to strip off a portion in the bonding side of the active layer wafer and thereby to form the active layer integrated with the supporting substrate wafer (see "Silicon Science" Chapter 6, Section 3, 3.2 Smart cut method, p. 465, issued on Jun. 28, 1996, Realize Co., Ltd.).

The ELTRAN method is defined by such a process in which first of all, a porous layer is formed in one of the surfaces of the active layer wafer by an anodization, a single crystal film is epitaxially grown on a top surface of the porous layer, and then the supporting substrate wafer having an oxide film formed over an entire area of an exposed surface thereof is bonded over the surface of the single crystal film side of the active layer wafer, and subsequently, the thermal processing is applied to said bonded wafer to enhance its bonding strength, and then the active layer wafer is ground from the other surface opposite to the bonding side surface until the porous layer is exposed. Alternatively, a water jet may be used to separate the bonded wafer in its porous layer. Subsequently, the exposed porous layer is subjected to a selective etching to thereby form the active layer composed of single crystal film (see "Silicon Science" Chapter 6, Section 4 ELTRAN, p. 467, issued on Jun. 28, 1996, Realize Co., Ltd.).

The SiGen method is defined by such a process in which first of all, a SiGe layer is formed on one of the surfaces of the active layer wafer, a single crystal film is grown on a top surface of this SiGe layer by a vapor phase growth, and then an oxide film is formed on that surface, and subsequently, hydrogen ions are implanted from said one of the surfaces of the wafer to thereby stimulate the development of strain within the SiGen layer, and then, the supporting substrate wafer having the oxide film formed over an entire area of an exposed surface thereof is bonded with the active layer wafer on said one surface side, and an inactive gas, such as $N_2$ gas, is injected thereon to induce a stripping in the location of strain within the SiGe layer. Subsequently, thus exposed SiGe layer is subjected to a selective etching.

According to the eighth invention, after the stripping, the periphery removing polishing is applied to said active layer wafer to remove the defective bonding portion in the peripheral region of the wafer to thereby make it operable as the active layer.

Employing such a periphery removing polishing process described above allows to eliminate a process for etching the periphery of the active layer, which has been conventionally required. As a result, the number of manufacturing processes of the bonding substrate can be reduced, and in conjunction with this, the manufacturing time of the bonding substrate can be also reduced.

Further, applying the periphery removing polishing may help prevent an etch pit from being developed in the peripheral surface of the supporting substrate wafer, which could be caused by the periphery etching of the active layer, and it may also prevent, in the bonding substrate represented by the bonding SOI substrate, a contamination and/or a scratching from being produced in the active layer, which could be caused by a mustache-shaped silicon oxide film portion left un-ground-off. This may enhance a production efficiency of non-defective units of the bonding substrate. As a result, a manufacturing cost of the bonding substrate may be reduced.

Furthermore, since the peripheral region of the active layer is removed not by the alkaline etching but by the polishing, an indent resultant from anisotropic etching would not be generated in the peripheral edge surface of the active layer even in a region other than those defined by multiples of 90 degrees in the circumferential direction starting from the location of the orientation flat or the notch taken as a reference. Owing to this, the peripheral edge surface of the active layer can be formed into smooth surface over an entire circumference thereof.

A ninth invention provides a manufacturing method of a bonding substrate, in which a polishing rate in the peripheral region of said active layer is controlled to be higher than that in the central region thereof.

Respective polishing rates in the peripheral region and the central region of the active layer are not limited to some specific values. The point is that any polishing rates may be employed as far as the defective bonding portion in the peripheral region of the active layer can be removed by the polishing at the time when the central region of the active layer has been polished to a desired thickness (it is to be noted there is a case where the central region has not been polished to the desired thickness).

In a specific example, the polishing rate may be in a range of 5.0 to 10.0 µm/minute for the peripheral region of the wafer and in a range of 0 to 2.0 µm/minute for the central region of the wafer.

A tenth invention provides a manufacturing method of a bonding substrate, in which a polishing pressure applied onto the peripheral region of said active layer is controlled to be higher than that applied onto the central region thereof.

In this manufacturing method, the polishing pressures are applied onto the bonding wafer such that the peripheral region of the active layer may be removed by the polishing at a time when the central region of the active layer has been polished to the desired thickness.

In a specific example, the polishing pressure applied onto the peripheral region of the wafer may be in a range of 1000 to 2500 $g/cm^2$ and that applied onto the central region of the wafer may be in a range of 0 to 500 $g/cm^2$.

An eleventh invention provides a manufacturing method of a bonding substrate, in which said periphery removing polishing step is executed by using a wafer periphery pressing jig which deforms the peripheral region of said active layer so as to be protruded more toward a polishing surface side than the central region thereof. The wafer periphery pressing jig will be described in detail later.

According to the eleventh invention, since the periphery removing polishing is executed by using the wafer periphery pressing jig under a condition where the peripheral region of the active layer wafer having a reduced thickness is deformed so as to be protruded more toward the polishing surface side (toward the polishing cloth) than the central region thereof, therefore the periphery removing polishing, which is a feature of the present invention, may be executed even with an existing polishing apparatus if only mounted with the wafer periphery pressing jig thereon.

A twelfth invention provides a manufacturing method of a bonding substrate further comprising, after said periphery removing polishing step, a partial periphery removing polishing step for polishing again exclusively a portion of said bonding wafer defined in a circumferential direction in said peripheral region so as to remove the active layer in said portion.

The amount to be polished off from said portion subjected to the polishing again may not be limited to a specific value. In one example, the amount to be polished off may be in a range of 1 to 20 µm.

As the pressing jig used in the partial periphery removing polishing may be employed, for example, such a pressing jig for removing a portion of the wafer which may deform only the portion desired to be removed in the peripheral region of the bonding wafer so as to be protruded toward the polishing surface side. The pressing jig for removing a portion of the wafer will be described in detail later.

According to the twelfth invention, applying such a partial periphery removing polishing allows a certain portion of the active layer to be removed in a larger extent specifically in a certain area in the circumferential direction of the peripheral region of the wafer, for example, in the area of the orientation flat or the notch, resulting in a wider terraced portion to be formed in the peripheral region of the supporting substrate wafer. Owing to this, even if such a wider terraced portion is applied with the laser marking, for example, the effect of the irradiated laser would not easily reach the active layer. As a result, the generation of the dust particles in the active layer during the laser marking can be inhibited.

A thirteenth invention provides a manufacturing method of a bonding substrate, in which said partial periphery removing polishing step is executed by using a pressing jig for removing a portion of the wafer (hereinafter referred to as a partial wafer removing pressing jig) which deforms only a portion desired to be removed in the peripheral region of said active layer so as to be protruded toward the polishing surface side.

The pressing jig for removing a portion of the wafer will be described in detail later.

A fourteenth invention provides a wafer periphery pressing jig interposed between a polishing head on which a semiconductor wafer is supported on a surface facing to a polishing cloth and said semiconductor wafer, said jig comprising: a jig body; and an annular protruding ridge section which is formed on a surface of said jig body defined in a semiconductor wafer supporting side and serves to deform the peripheral region of said semiconductor wafer to be protruded more toward a polishing surface side than the central region thereof.

The semiconductor wafer may include, for example, a silicon wafer and a gallium arsenide wafer. The semiconductor wafer may be a single element or maybe a bonding substrate comprising two semiconductor wafers that have been bonded with each other (including a bonding SOI substrate).

As the base material for making the wafer periphery pressing jig may be employed, for example, rigid resins such as Duracon (a brand name of polyacetal), PEEK (polyether etherketone) and polycarbonate, metals such as SUS or ceramics. The material of the protruding ridge section may be similar material as described above. The protruding ridge section may be formed integrally with the jig body. Alternatively, it may be formed separately.

The shape of the wafer periphery pressing jig may be modified in association with the exterior shape of the bonding wafer. A size of the wafer periphery pressing jig may be modified in association with a size of the bonding wafer to be polished.

The shape of the jig body may not be limited to specific ones. For example, it may be made in a circular-disk shape or in a circular cylindrical shape.

The exterior shape of the protruding ridge section may be modified appropriately in association with the shape of individual semiconductor wafer, for example, a semiconductor wafer having a notch or having an orientation flat.

Further, the protruding ridge section may be formed continuously or formed intermittently.

During the periphery removing polishing, the central region of the semiconductor wafer excluding the peripheral region thereof is pressed by a region in the jig body defined in an inner side than the protruding ridge section. The central region may be pressed by using a flat surface of the polishing head in its wafer supporting side. It is to be noted that the central region of the semiconductor wafer may not be necessarily pressed. Accordingly, the wafer periphery pressing jig may have a ring-shaped jig body. A size of a wafer pressing plane may be modified in association with a size of the semiconductor wafer. As for the supporting of the semiconductor wafer onto the wafer periphery pressing jig, in one example, the vacuum suction or a template supporting may be employed.

A tip end face of the protruding ridge section may be configured to be an inclined plane getting lower toward the central portion of the jig body. The angle of inclination of the inclined plane may be modified appropriately within a range of 0.1 to 90 degrees in association with the amount to be polished off in the peripheral region of the semiconductor wafer. In case where a large amount of mass is to be polished off from the peripheral region of the wafer with a reduced width, the angle of the inclination should be made greater. This inclined plane may not be linear in cross section but it may assume a curved plane similar to the bevel shape of the wafer.

According to the fourteenth invention, the wafer periphery pressing jig is used to deform the peripheral region of the semiconductor wafer so as to be protruded more toward the polishing surface side than the central region thereof, thus to carry out the periphery removing polishing.

Employing such a periphery removing polishing process as described above allows, in the semiconductor wafer made up of the bonding substrate, to eliminate the periphery grinding process of the active layer wafer as well as the periphery etching process of the active layer, which have been required in the prior art method. As a result, the number of manufacturing processes of the bonding substrate can be reduced, and in conjunction with this, the manufacturing time of the bonding substrate can be also reduced.

Further, in case where the semiconductor wafer is made up of bonding wafer for SOI substrate for example, applying the periphery removing polishing thereto may help prevent an etch pit from being developed in the peripheral surface of the supporting substrate wafer, which could be caused by the periphery etching of the active layer, and it may also prevent a contamination and/or a scratching from being produced in the active layer, which could be caused by a mustache-shaped silicon oxide film portion left un-ground-off. This may enhance a production efficiency of non-defective units of the bonding substrate. As a result, a manufacturing cost of the bonding substrate may be reduced. Further, such a bonding substrate containing an active layer with a notch formed therein may be fabricated in a simple manner.

Furthermore, since the peripheral region of the active layer is removed not by the alkaline etching but by the polishing, an indent resultant from anisotropic etching would not be generated in the peripheral edge surface of the active layer even in a region other than those defined by multiples of 90 degrees in the circumferential direction starting from the location of the orientation flat or the notch taken as a reference. Owing to this, the peripheral edge surface of the active layer can be formed into smooth surface over an entire circumference thereof.

Yet further, since the periphery removing polishing is executed by using the wafer periphery pressing jig under a condition where the peripheral region of the active layer wafer having a reduced thickness is deformed so as to be protruded more toward the polishing surface side than the central region thereof, therefore the periphery removing polishing may be carried out even with an existing polishing apparatus if only mounted with the wafer periphery pressing jig thereon.

A fifteenth invention provides a wafer periphery pressing jig, in which a notch pressing section is formed in said protruding ridge section, said notch pressing section being operative to deform a notch portion formed in the peripheral region of said semiconductor wafer so as to be protruded more toward the polishing surface side than the central region thereof.

The notch pressing section is a part of the protruding ridge section formed in a portion along an inner circumferential edge thereof to be pressed onto the notch forming portion in the semiconductor wafer. The notch pressing section has a similar figure to that of the notch of the semiconductor wafer and is configured to be larger than the notch by 0.1 to 0.5 mm.

According to the fifteenth invention, since during the periphery removing polishing by using the wafer periphery pressing jig, the notch portion of the semiconductor wafer is deformed by the notch pressing section so as to be protruded more toward the polishing surface side than the central region of the wafer, therefore the periphery removing polishing process can be carried out in conjunction with the polishing of the notch portion.

A sixteenth invention provides a wafer periphery pressing jig, in which an orientation flat pressing section is formed in said protruding ridge section, said orientation flat pressing section being operative to deform an orientation flat portion formed in the peripheral region of said semiconductor wafer so as to be protruded more toward the polishing surface side than the central region thereof.

The orientation flat pressing section is a part of the protruding ridge section formed into a half-moon figure in a portion along an inner circumferential edge thereof to be pressed onto an orientation flat forming portion in the semiconductor wafer. The orientation flat pressing section has a similar figure to that of the orientation flat of the semiconductor wafer and is configured to be smaller than the orientation flat by 0.1 to 0.5 mm.

According to the sixteenth invention, since during the periphery removing polishing by using the wafer periphery pressing jig, the orientation flat portion of the semiconductor wafer is deformed by the orientation flat pressing section so as to be protruded more toward the polishing surface side than the central region of the wafer, therefore the periphery removing polishing process can be carried out in conjunction with the polishing of the orientation flat portion.

A seventeenth invention provides a pressing jig for removing a portion of a wafer (i.e., a partial wafer removing jig) interposed between a polishing head on which a bonding wafer comprising an active layer bonded with a supporting substrate wafer is supported with said active layer facing to a polishing cloth and said bonding wafer, said jig comprising: a jig body, and a partial protruding section which is formed on a surface of said jig body defined in a supporting side of the bonding wafer and is operative to deform only a portion desired to be removed in a peripheral region of said active layer to be protruded toward the polishing surface side.

As the base material for making the partial wafer removing pressing jig may be employed, for example, rigid resins such as Duracon, PEEK and polycarbonate, metals such as SUS or ceramics. The material of the partial protruding section may be similar material as described above. The partial protruding section may be formed integrally with the jig body. Alternatively, it may be formed separately.

The shape of the partial wafer removing pressing jig may be modified in association with the exterior shape of the bonding wafer. Further, a size of the partial wafer removing pressing jig may be modified in association with a size of the bonding wafer to be polished.

The shape of the jig body may not be limited to specific ones. For example, it may be made in a circular-disk shape or in a circular cylindrical shape.

The exterior shape of the protruding section may be modified appropriately in association with the shape of the portion desired to be removed in the peripheral region of the bonding wafer, for example the half-moon shape configured in a size affordable to cover the notch portion or the orientation flat portion.

In the bonding wafer, not only the central region of the bonding wafer but also the portions in the peripheral region of the wafer except the portions desired to be removed are pressed by the region of the jig body located in an inner side of the partial protruding section. The central region of the bonding wafer may be pressed by using a flat plane of the polishing head in its wafer supporting side. As for the supporting of the bonding wafer onto the partial wafer removing pressing jig, in one example, the vacuum suction or a template supporting may be employed.

A tip end face of the protruding section may be configured to be an inclined plane getting lower toward the central portion of the jig body. The angle of inclination of the inclined plane may be modified appropriately within a range of 0.1 to 90 degrees in association with the amount to be polished off from the peripheral region of the bonding wafer. In case where an amount to be polished off from the peripheral region of the wafer is to be increased, the angle of the inclination should be made greater. This inclined plane may not be linear in cross section but it may assume a curved plane similar to the bevel shape of the wafer.

According to the seventeenth invention, by using the partial protruding section of the partial wafer removing pressing jig, only the portion desired to be removed in the peripheral region of the bonding wafer, which has been previously processed with the periphery removing polishing, is deformed to be protruded toward the polishing surface side, so that only this protruded portion may be pressed against the polishing cloth for applying the periphery removing polishing. BY way of this, a certain portion of the active layer is removed in a larger extent specifically in a certain area in the circumferential direction of the peripheral region of the wafer, for example, in the area of the orientation flat portion or the notch portion, so as for these areas to be formed into a wider portion of inclined plane. Owing to this, even if such a wider portion is applied with the laser marking, the effect of the irradiated laser would not easily reach the active layer. As a result, the generation of the dust particles in the active layer during the laser marking can be inhibited.

An eighteenth invention provides a partial wafer removing pressing jig, in which at least a portion to be brought into contact with the polishing cloth in said jig body and/or in said partial protruding section is made of such material that is not likely to be polished off as compared to the other parts thereof.

Said material that is not likely to be polished off may not be limited to specific ones. For example, rigid resins such as Duracon, PEEK and polycarbonate, or ceramics may be employed.

The material that is not likely to be polished off may be used exclusively in the jig body or exclusively in the partial protruding section. Alternatively, it may be used in both of the jig body and the partial protruding section. The partial protruding section may be formed integrally with the jig body. Alternatively, it may be formed as a separate component.

According to the eighteenth invention, even if a part of the jig body and/or the partial protruding section comes into contact with the polishing cloth during the polishing process, since the contacting portion is made of material that is not likely to be polished off, the jig body and/or the partial protruding section would be hardly susceptible to the damage from the polishing cloth.

BEST MODE FOR CARRYING OUT THE INVENTION

Preferred embodiments of the present invention will now be described with reference to the attached drawings. It is to be appreciated that the present invention is not limited to those embodiments. First of all, referring to FIG. 1 through FIG. 16, a first embodiment will be described.

Figure 1:
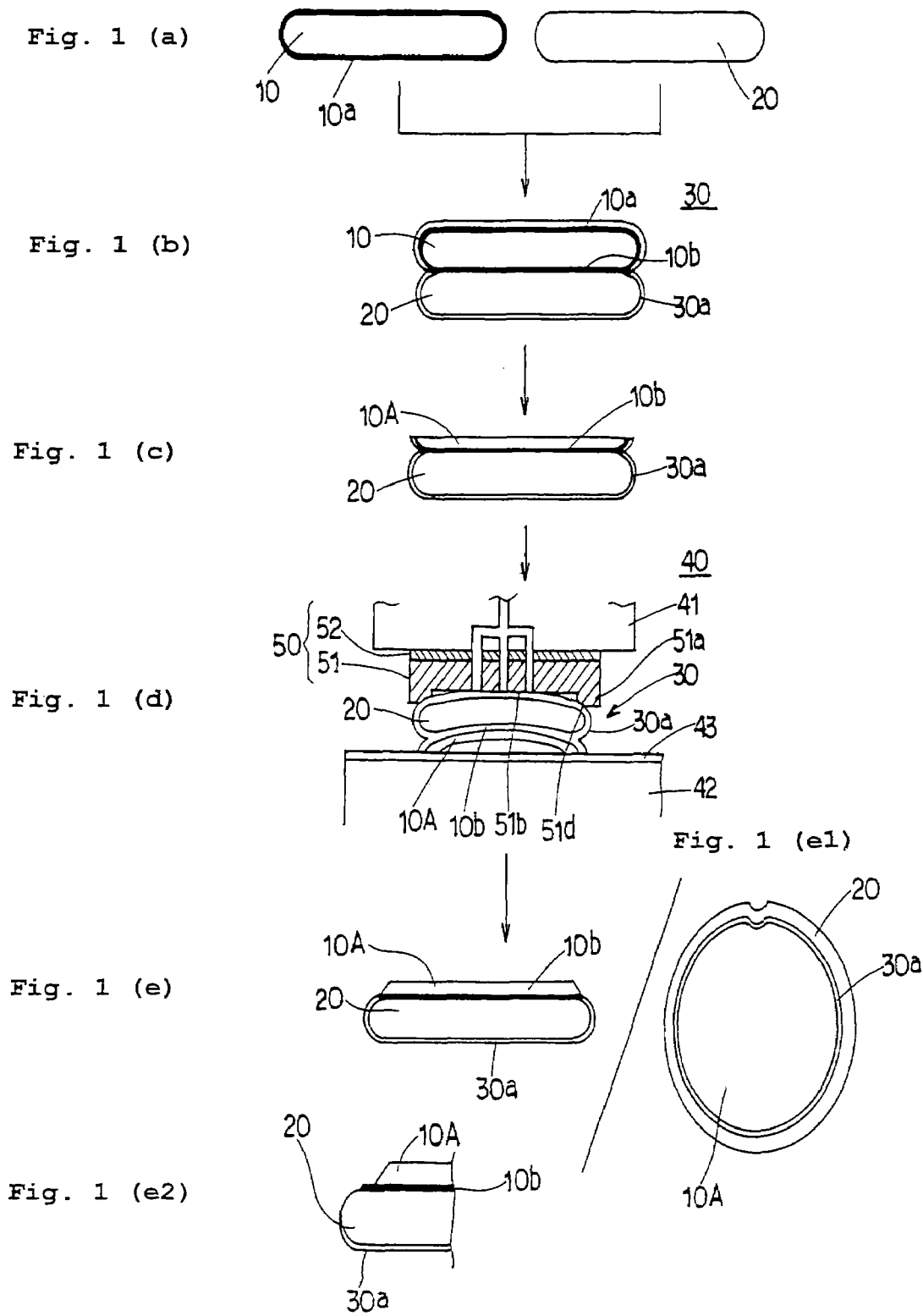
FIG. 1 is a flow chart showing a manufacturing method of a bonding substrate according to a first embodiment of the present invention.

As shown in FIG. 1, first of all, a single crystal silicon ingot is pulled up by using the Czochralski method, and then thus obtained single crystal silicon ingot is applied to a series of processing consisting of block cutting, notch processing, slicing, beveling, lapping, etching and mirror polishing to prepare a mirror finished active layer wafer 10 with a notch having a thickness of 725 µm and a diameter of 200 mm. On the other hand, by using the same production processes as those applied to this active layer wafer 10, a mirror finished supporting substrate wafer 20 with notch having the same thickness and the same diameter therewith is prepared (FIG. 1(a)). It is to be noted that the active layer wafer 10 and the supporting substrate wafer 20 may not have the same thickness. One of them, the active layer wafer 10 is introduced in a thermal oxidation furnace to experience the thermal oxidation processing, so that its exposed surface is entirely covered with an insulating silicon oxide film 10a. In this connection, it is to be appreciated that the supporting substrate wafer 20 may be exclusively oxidized or both of said two wafers 10, 20 may be oxidized.

After that, the both wafers 10, 20 are placed in one on the other with their mirror surfaces contacting to each other under the room temperature in a clean room (FIG. 1(b)). By way of this, a bonding wafer 30 is formed. Through this bonding, the portion of silicon oxide film 10a interposed between the active layer wafer 10 and the supporting substrate wafer 20 defines an implanted silicon oxide film 10b.

Then, if desired, the bonding wafer 30 is introduced into the thermal oxidation furnace for bonding where the bonding thermal processing is applied to the bonding wafer 30 under an oxidizing atmosphere. The bonding temperature is set at 1100° C. and the thermal processing time is two hours (again FIG. 1(b)). Through this process, the exposed surface of the bonding wafer 30 is covered entirely with a silicon oxide film 30a. As a result, the exposed oxide film of the active layer wafer 10 will become thicker. Thus, the reason why the bonding thermal processing is not necessarily required in forming the bonding wafer 30 is because a surface grinding will be applied later to the active layer wafer 10 and also only the periphery removing polishing is applied to the SOI layer 10A. This is owing to the fact that a bonding strength can be sufficiently maintained even by the bonding under the condition of room temperature since the grinding as well as the etching to the peripheral region are no more applied.

Subsequently, a void inspection is performed by using an infrared ray. The void refers to a void defect caused by a defective bonding in a bonding interface between the active layer wafer 10 and the supporting substrate wafer 20. A non-defective bonding wafer 30 is subjected to a surface grinding with a resinoid grinding wheel in a grade of #300 to #2000, which is applied to a top surface side of the active layer wafer 10 (FIG. 1(c)). At that time, the amount to be ground off from the surface is around 700 µm, and the thickness of the active layer wafer 10 with its reduced thickness after the processing may be around 20 µm. A total thickness variation (TTV) of the bonding wafer 30 may be equal to or less than 1 µm.

After that, a wafer periphery pressing jig 50 is used to apply a periphery removing polishing process to the ground surface of the active layer wafer 10 with reduced thickness for removing a defective bonding portion in the peripheral region which has been developed during the bonding and for leaving the central region, to thereby fabricate the SOI layer 10A, (FIG. 1(d)).

Figure 2:
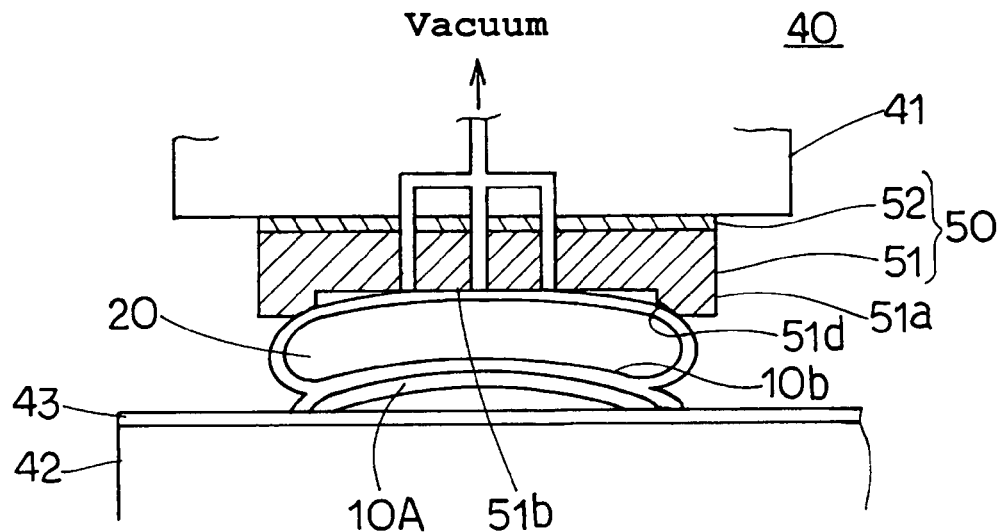
FIG. 2 is a longitudinal sectional view showing a condition of a periphery removing polishing process in the manufacturing method of the bonding substrate according to the first embodiment of the present invention.
Figure 3:
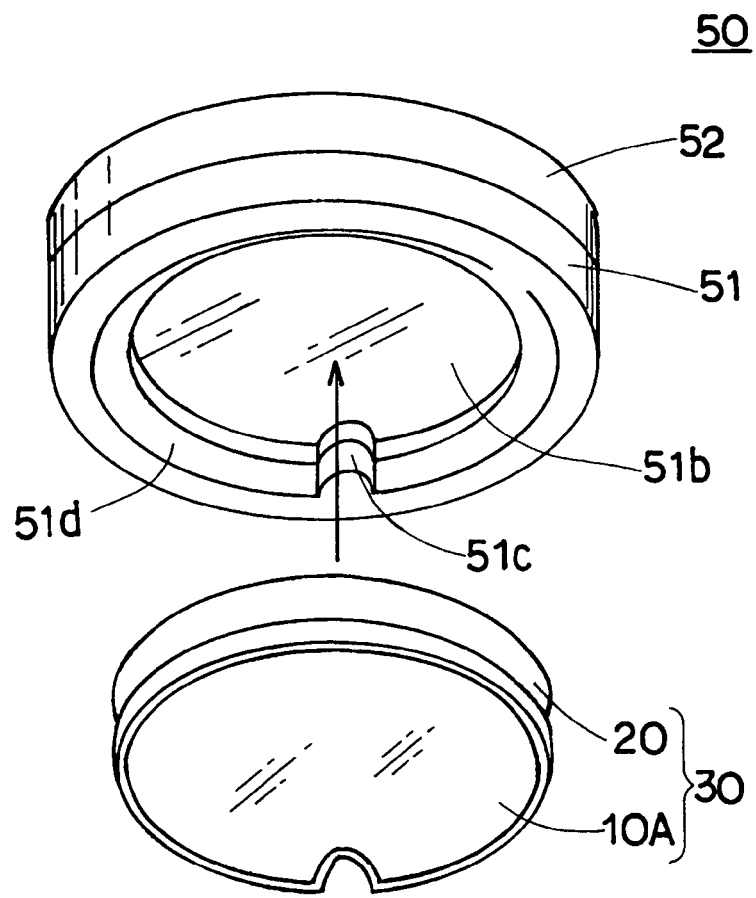
FIG. 3 is a perspective view showing a process for mounting a bonding wafer to a wafer periphery pressing jig employed in the manufacturing method of the bonding substrate according to the first embodiment of the present invention.

Firstly, the wafer periphery pressing jig 50 will now be described in detail with reference to FIG. 2 and FIG. 3.

The wafer periphery pressing jig 50 comprises a jig body 51, an annular protruding ridge section 51a which is formed integrally with the jig body 51 in a circumferential lower surface side thereof and serves to deform the peripheral region of the active layer wafer 10 after having been processed by the surface grinding to be protruded more toward the polishing surface side than the central region, and a double-sided tape 52 to be affixed on a top surface of the jig body 51.

The jig body 51 is made of rigid resin such as PEEK and formed into a thick disk-like shape. The double-sided tape 52 is affixed by one of the surfaces thereof on the top surface of the jig body 51. A region of the jig body 51 located in an inner side of the protruding ridge portion 51a forms a wafer pressing section to press an entire zone of a central region of the bonding wafer 30 from a back surface thereof. A size of that region, or a size of a pressing surface 51b for the bonding wafer 30, is configured such that, for the case of the bonding wafer 30 having a diameter of 200 mm to be processed with the periphery removing polishing by about 1.0 mm in the wafer peripheral region and by about 3.0 mm in the notch portion, a diameter for the notch portion should be about 197 mm and that for the other portions than the notch portion should be about 199 mm. The bonding wafer 30 is supported on the pressing surface 51b by a vacuum suction.

A notch pressing section 51c is formed in a part of an inner circumferential surface of the protruding ridge portion 51a, which serves to deform a notch portion of the active layer wafer 10 via a notch portion of the supporting substrate wafer 20 so as to be protruded more toward the polishing surface side than the central region of the active layer wafer 10.

An inner circumferential portion of a tip end face of the protruding ridge section 51a defines a tapered plane 51d having its height getting lower gradually toward a central portion of the jig body 51. An inclination angle θ of the tapered plane 51d is 30°. However, the inclination angle may be appropriately set within a range of 0.1° to 90°.

The wafer periphery pressing jig 50 is affixed with the double-sided tape 52 to a lower surface of the polishing head 41 of the polishing apparatus 40 of single wafer processing type. After that, by using the wafer periphery pressing jig 50, the bonding wafer 30, which has been processed with the surface grinding, is supported with its active layer wafer 10 side facing downward. Subsequently, the surface to be ground of the active layer wafer 10 is pressed against a polishing cloth 43 affixed on a top surface of a polishing platen 42 via a sponge rubber interposed therebetween, to thereby remove the wafer peripheral region. BY way of this, a defective bonding portion of the active layer wafer 10 is removed. The polishing cloth 43 is a soft non-woven pad, Suba 600 (Asker hardness 80°) manufactured by Rodale.

During the periphery removing polishing process, a revolving speed of the polishing head 41 is set at 60 rpm and a revolving speed of the polishing platen 42 is set at 120 rpm. During this process, a polishing pressure of the active layer wafer 10 against the polishing cloth 43 applied via the wafer periphery pressing jig 50 is in the order of 0 kg/cm$^2$ for the central region of the active layer wafer 10 and in the order of 500 kg/cm$^2$ for the peripheral region of the same. This results in a polishing rate of the order of 5 to 10 µm/minute for the wafer peripheral region and the polishing rate of the order of 0 µm/minute for the wafer central region. The amount to be polished off is in the order of 0 µm for the central region of the active layer wafer 10 and in the order of 20 µm for the wafer peripheral region, which causes the active layer wafer 10 to be removed in this region. A supply amount of the polishing agent containing abrasive grains (colloidal silica) is at a rate of 1800 ml/minute.

As described above, since in the present invention, the surface grinding is directly applied to the active layer wafer 10 side of the bonding wafer 30, which has been subjected to the bonding thermal processing, so as to reduce the thickness of the active layer wafer 10 without applying the periphery grinding, and then the periphery removing polishing is applied to the active layer wafer 10 to remove the defective bonding portion developed during the bonding process in the peripheral region and to leave the central region as it is so as to form the SOI layer 10A, therefore the periphery grinding as well as the periphery etching, which have been both needed in the prior art, can now be eliminated. As a result, the number of manufacturing processes of the bonding SOI substrate can be reduced and in conjunction with this, the manufacturing time of the bonding SOI substrate can be also reduced. The thickness of the obtained SOI layer 10A is in the order of 15 to 20 μm and the TTV thereof is in the order of 1 to 5 μm.

Further, applying such periphery removing polishing allows to solve the problems involved in the wafer quality associated with the prior art, including the problem of the etch pit which could be developed in the peripheral surface of the supporting substrate wafer by the periphery etching of the SOI layer and also the problem of the contamination and/or scratching which could be produced in the SOI layer by the mustache-shaped silicon oxide film portion left un-ground-off in the peripheral region of the SOI layer and then stripped and dispersed therefrom. This may enhance a production efficiency of non-effective units of the bonding SOI substrate. As a result, a manufacturing cost of the bonding SOI substrate can be reduced. Further, such a bonding SOI substrate containing the SOI layer with the notch formed therein, which has been considered difficult to fabricate in the conventional process, can now be fabricated in a simple manner. Consequently, the area available for forming the device on the SOI layer 10A can be extended as compared to the case of the SOI layer having the orientation flat.

Furthermore, since the peripheral region of the SOI layer 10A is removed not by the alkaline etching as practiced in the prior art but by the mechanical polishing (periphery removing polishing), an indent resultant from the anisotropic etching would not be generated in the peripheral edge surface of the SOI layer 10A even in a region other than those defined by multiples of 90 degrees in the circumferential direction starting from the location of the notch taken as a reference, or in the region having uneven crystal orientation. Owing to this, the peripheral edge surface of the SOI layer 10A can be formed into smooth surface over an entire circumference thereof.

In thus obtained SOI substrate, the peripheral face of the SOI layer 10A forms a polished tapered plane defined from the peripheral edge of the surface of the SOI layer 10A to the peripheral edge of the bonding interface of the supporting substrate wafer 20 having its defective bonding portion removed, as shown in FIG. 1(e) and FIG. 1(e1). In addition, the notch is formed in one part of the peripheral region of the SOI layer 1A. Further, as shown in FIG. 1(e2), sometimes, the silicon oxide film 30a in the periphery of the supporting substrate wafer 20 may be polished.

Further, since the periphery removing polishing is executed by using the wafer periphery pressing jig 50 under a condition where the peripheral region of the active layer wafer 10 having a reduced thickness is deformed so as to be protruded more toward the polishing surface side than the central region thereof, therefore the periphery removing polishing, which is a feature of the first embodiment, may be carried out with the existing polishing apparatus 40 only by mounting the wafer periphery pressing jig 50 on an under surface of the polishing head 41.

Thus fabricated bonding SOI substrate is applied to a surface grinding with high precision and low damage or a high precision polishing by using a double-sided polishing apparatus, though not shown, in order to control the TTV of the SOI layer 10A to be equal to or lower than 1 μm, in which a predetermined processing is carried out until the thickness of the SOI layer 10A reaches the range of 5 to 10 μm. Subsequently, by using the polishing apparatus of single wafer processing type, though not shown, the SOI layer 10A is finished to have a layer thickness of final desired value of 3 μm.

Then, if desired, a thermal processing is applied to thus fabricated SOI substrate in order to enhance a bonding strength of the bonding wafer 30 as well as to remove a crystal defect, such as COP, precipitation of oxygen and OSP, from the surface of the SOI layer 10A (hereinafter this thermal processing will be referred to as no-defect thermal processing). Specifically, the thermal processing is carried out at the temperature of 1200° C. in the $H_2$ gas atmosphere for one hour. In this way, since the thermal processing is applied after the central region of the SOI layer 10A has been polished, the surface of the SOI layer 10A may be actually formed into a no-defect surface containing no crystal defect existing therein. Further advantageously, the bonding strength of the bonding wafer 30 can be also enhanced.

After that, thus obtained SOI substrate is cleaned, packed in a wafer case, for example, and shipped to a device manufacturer.

In this connection, with reference to FIG. 4 through FIG. 13, a wafer periphery pressing jig having a configuration different from that of the wafer periphery pressing jig 50 of the first embodiment will be exemplarily described.

Figure 4:
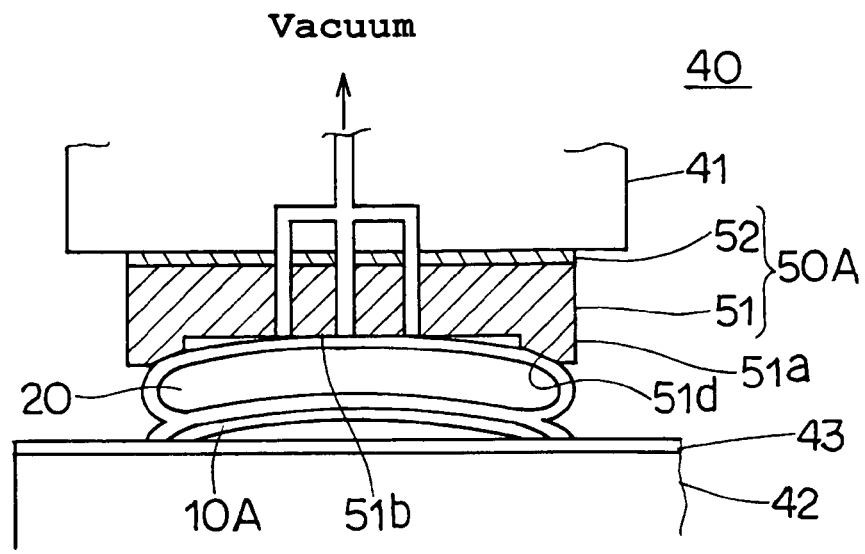
FIG. 4 is a sectional view showing a wafer periphery pressing jig in use for a wafer with an orientation flat according to another embodiment of the present invention.
Figure 5:
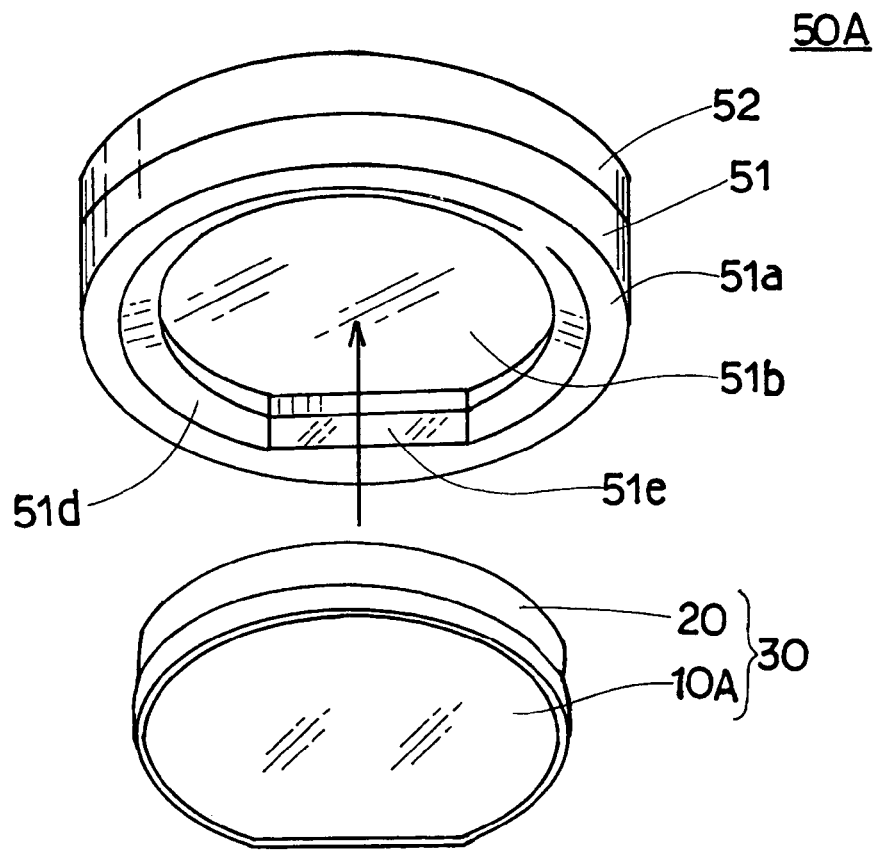
FIG. 5 is a perspective view showing a process for mounting a wafer to the wafer periphery pressing jig according to said another embodiment of the present invention.

A wafer periphery pressing jig 50A shown in FIG. 4 and FIG. 5 represents an example with a configuration allowing for the periphery removing polishing of the bonding wafer 30 having an orientation flat. An orientation flat pressing section 51e is arranged in one part of the tapered plane 51d of the protruding ridge portion 51a, which is protruding toward the central region of the pressing surface 51b, and serves to deform the orientation flat portion of the active layer wafer 10 to be protruded more toward the polishing surface side than the central region of the active layer wafer 10 via the supporting substrate wafer 20. Other configuration, operation and effect of the wafer periphery pressing jig 50A are substantially the same as those of the wafer periphery pressing jig 50 of the first embodiment.

Figure 6:
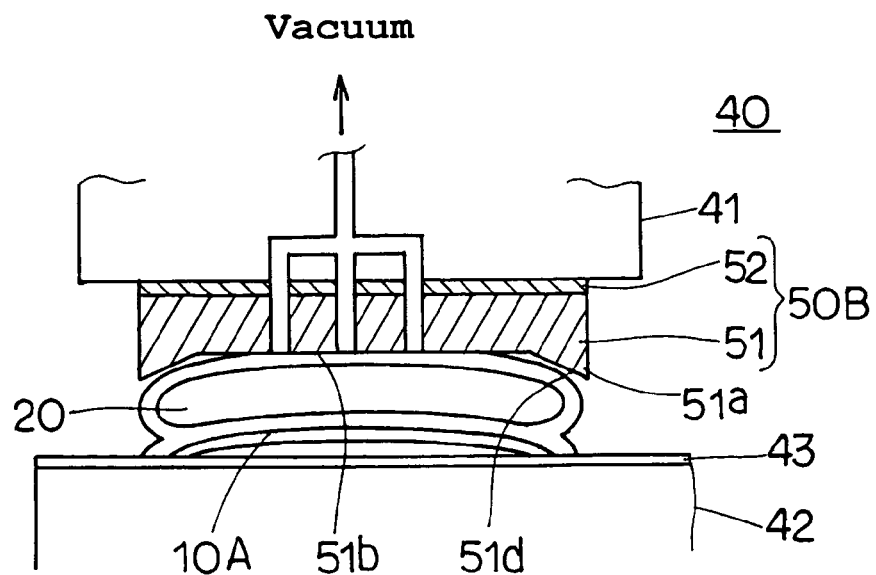
FIG. 6 is a sectional view showing a wafer periphery pressing jig in use for a wafer with an orientation flat according to yet another embodiment of the present invention.
Figure 7:
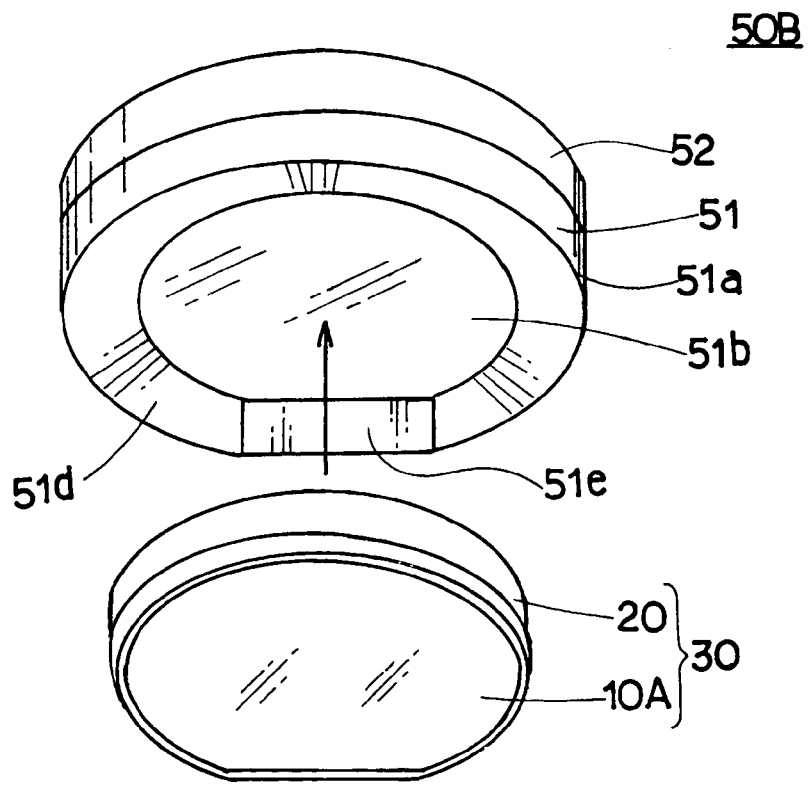
FIG. 7 is a perspective view showing a process for mounting a wafer to the wafer periphery pressing jig according to said yet another embodiment of the present invention.

A wafer periphery pressing jig 50B shown in FIG. 6 and FIG. 7 represents a jig including an orientation flat pressing section 51e formed in one part of the tapered plane 51d for applying the periphery removing polishing to the bonding wafer 30 having an orientation flat, in which the tapered plane 51d of the protruding ridge section 51a forms a wide tapered plane defined from an outer circumferential edge of a tip end of the protruding ridge section 51a to an inner circumferential edge of a bottom of the protruding ridge section 51a. Other configuration, operation and effect of the wafer periphery pressing jig 50B are substantially the same as those of the wafer periphery pressing jig 50 of the first embodiment.

Figure 8:
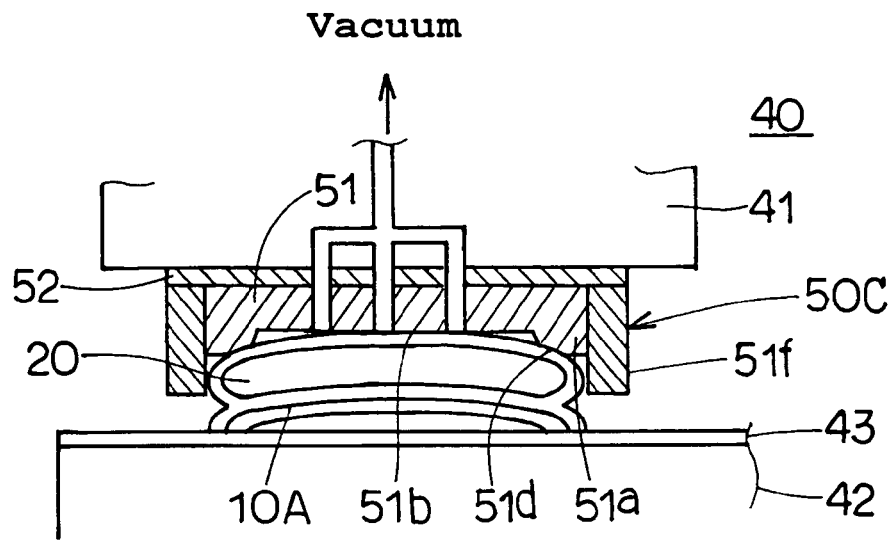
FIG. 8 is a sectional view showing a wafer periphery pressing jig in use for a wafer with an orientation flat according to still another embodiment of the present invention.
Figure 9:
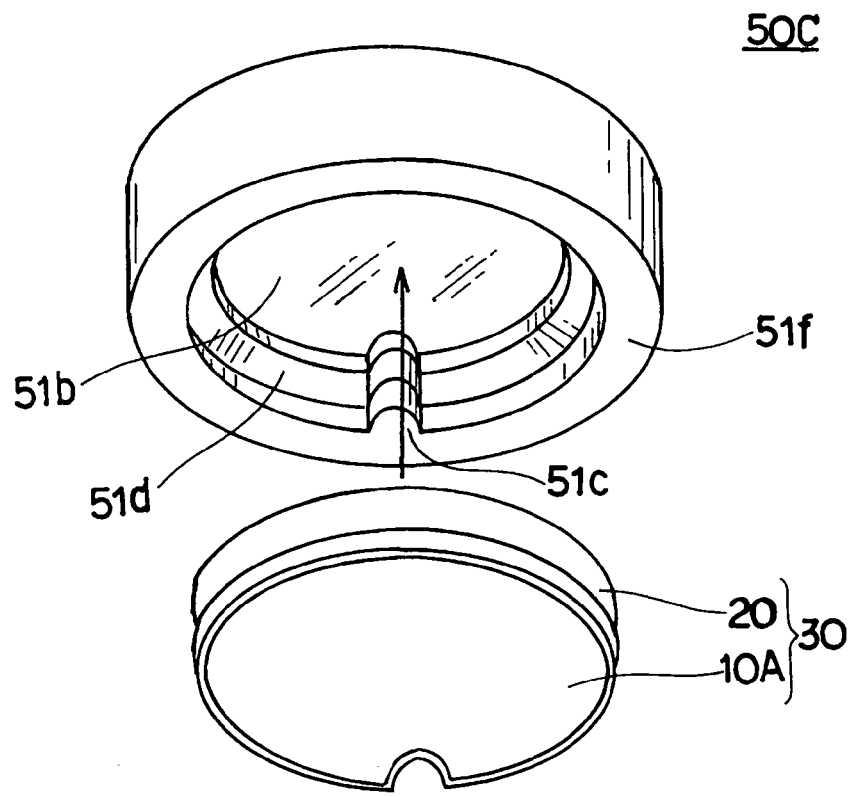
FIG. 9 is a perspective view showing a process for mounting a wafer to the wafer periphery pressing jig according to said still another embodiment of the present invention.

Next, FIG. 8 and FIG. 9 show another example of the wafer periphery pressing jig designated generally by reference numeral 50C, comprising the jig body 51 which is made thicker and bonded to the polishing head 41 by the double-sided tape 52, and an annular template 51f which is arranged on an outer circumference of the protruding ridge section 51a to accommodate and hold the supporting substrate wafer 20 having the notch. The jig body 51, the protruding ridge section 51a and the template 51f are all made of the same material and formed integrally in one body. Employing the template 51f helps enhance the holding force of the bonding wafer 30 during the periphery removing polishing. In this case, preferably, a play of the bonding wafer 30 within the template 51f should be made as small as possible. If so, the removing width in the radial direction of the wafer may be made uniform across the entire area of the peripheral region of the bonding wafer 30.

Other configuration, operation and effect are within the range of presumption based on the wafer periphery pressing jig 50 of the above first embodiment, and its detailed description should be herein omitted.

Figure 10:
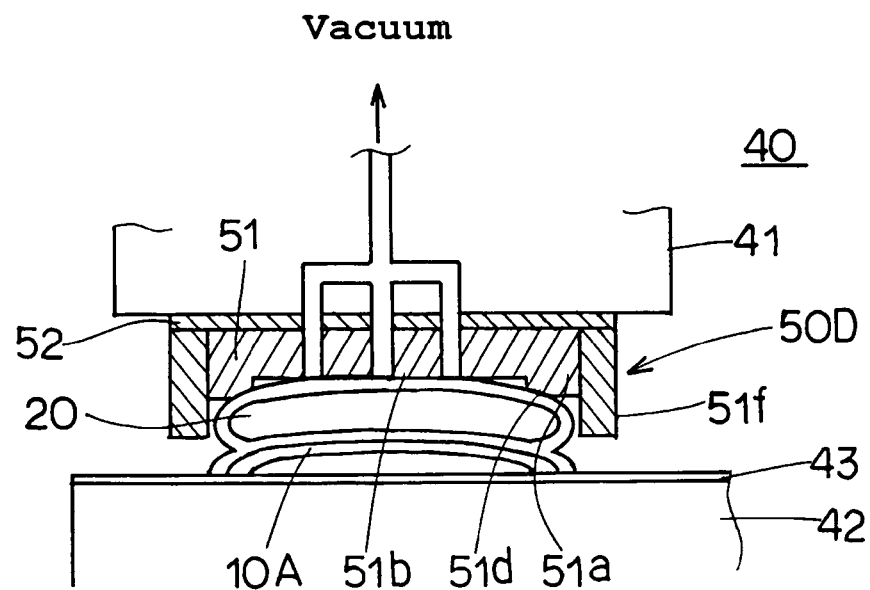
FIG. 10 is a sectional view showing a wafer periphery pressing jig in use for a wafer with an orientation flat according to an alternative embodiment of the present invention.
Figure 11:
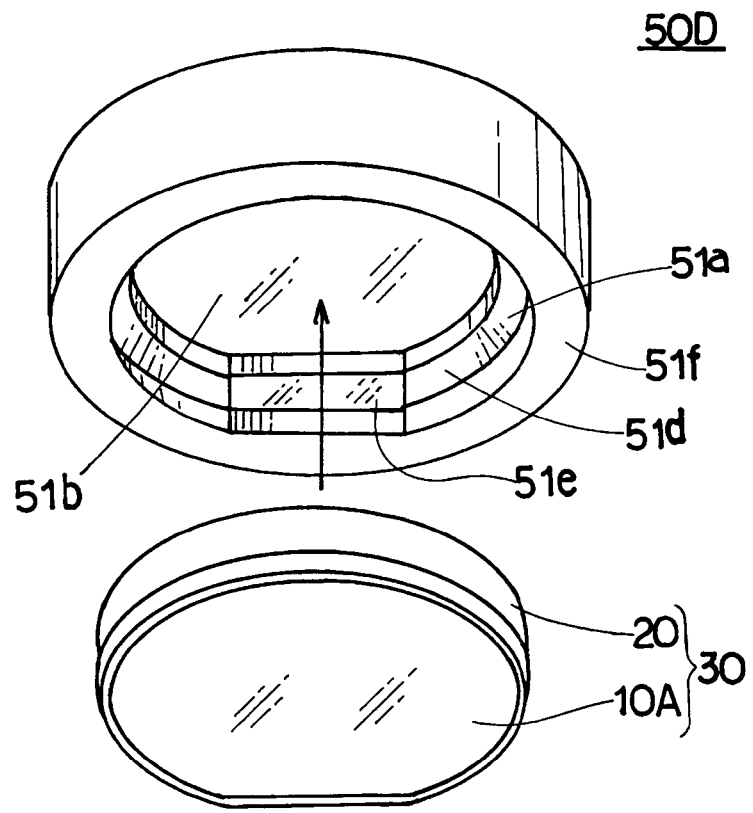
FIG. 11 is a perspective view showing a process for mounting a wafer to the wafer periphery pressing jig according to said alternative embodiment of the present invention.

Further, FIG. 10 and FIG. 11 show a wafer periphery pressing jig 50D for the bonding wafer 30 having the orientation flat, which is an example equipped with said template 51*f*. Other configuration, operation and effect of the wafer periphery pressing jig 50D are substantially the same as those of the wafer periphery pressing jig 50 described above.

Figure 12:
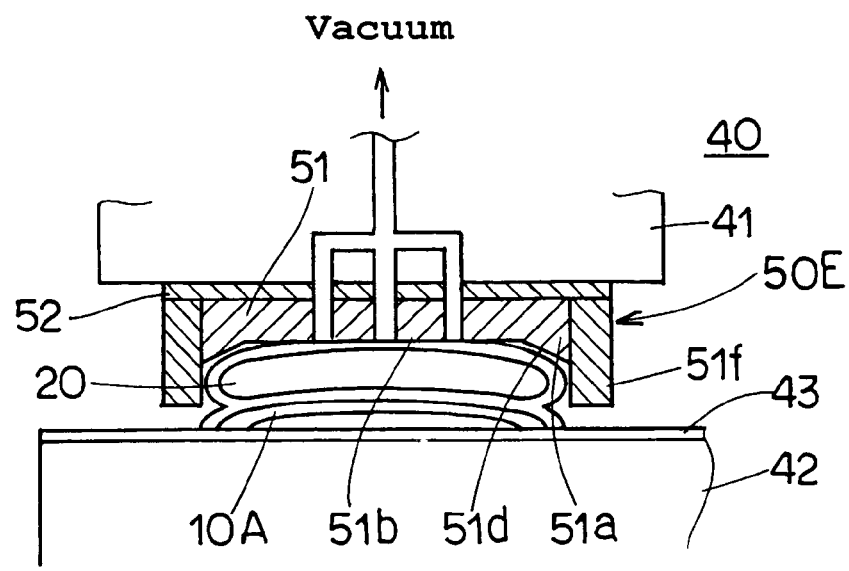
FIG. 12 is a sectional view showing a wafer periphery pressing jig in use for a wafer with a notch according to another alternative embodiment of the present invention.
Figure 13:
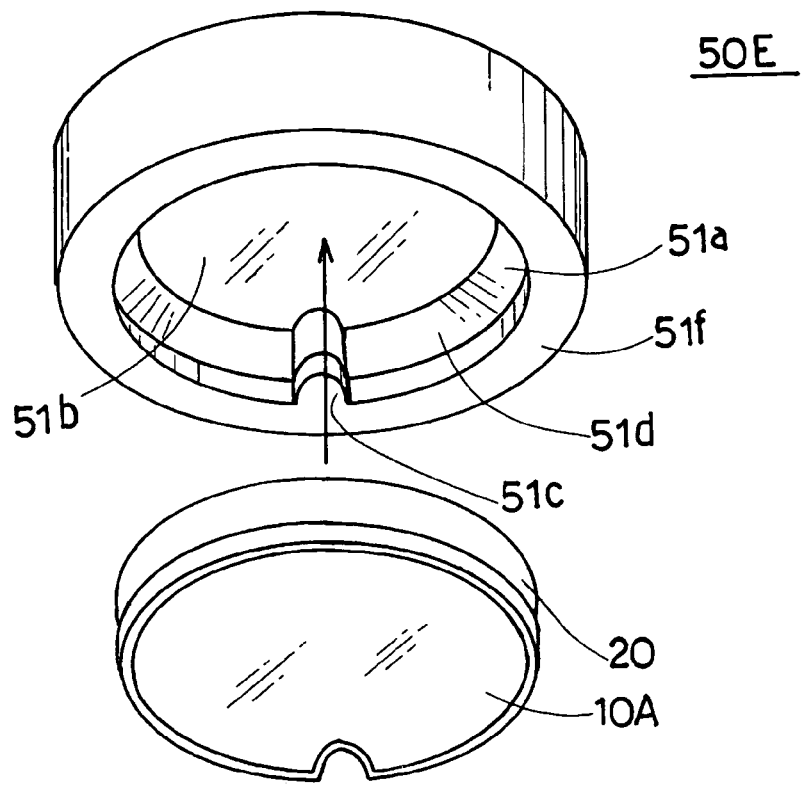
FIG. 13 is a perspective view showing a process for mounting a wafer to the wafer periphery pressing jig according to said another alternative embodiment of the present invention.

Furthermore, FIG. 12 and FIG. 13 show another example of the wafer periphery pressing jig designated generally by reference numeral 50E, in which the tapered plane 51*d* of the protruding ridge section 51*a* defines a wide tapered plane extending from the outer circumferential edge of the tip end of the protruding ridge section 51*a* up to the inner circumferential edge of the bottom of the protruding ridge section 51*a*, and further the template 51*f* is provided. The notch pressing section 51*c* is formed in one part of the tapered plane 51*d*. Other configuration, operation and effect of the wafer periphery pressing jig 50E are substantially the same as those of the wafer periphery pressing jig 50 described above.

Figure 14:
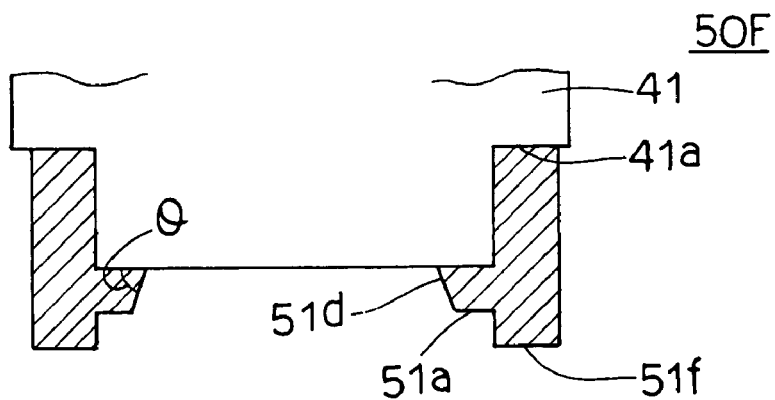
FIG. 14 is a sectional view showing a wafer periphery pressing jig according to yet another alternative embodiment of the present invention.

A wafer periphery pressing jig 50F shown in FIG. 14 represents an example in which the jig body 51 also serves as the template 51*f* to be fitted with the annular groove 41*a* formed in a lower portion of the polishing head 41 from outer side thereof. The template 51*f* is the same type as that of the wafer periphery pressing jig 50C described above, that accommodates and holds the supporting substrate wafer 20 having the notch. The protruding ridge section 51*a* and the template 51*f* are both made of the same material to be formed integrally in one body. In the drawing, θ designates an angle of inclination of the tapered plane 51*d* of the protruding ridge section 51*a*.

Since the jig body is annular, the under part of the polishing head 41 serves as the wafer pressing section. The bonding wafer 30 is vacuum chucked directly onto the under surface of this polishing head 41.

Other configuration, operation and effect of the wafer periphery pressing jig 50F are within the range of presumption based on the wafer periphery pressing jig 50 of the first embodiment described above, and the detailed explanation thereof should be herein omitted.

Figure 15:
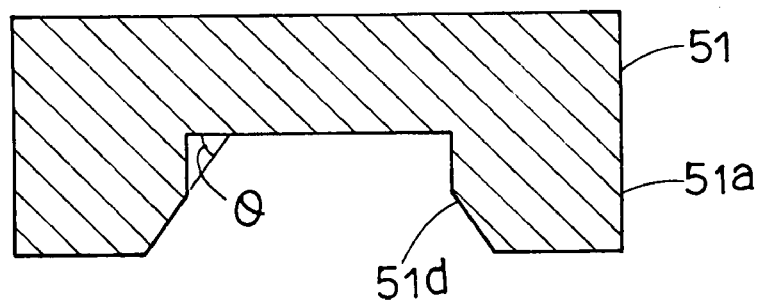
FIG. 15 is a sectional view showing main part of a partial wafer removing pressing jig employed in the manufacturing method of the bonding substrate according to the first embodiment of the present invention.
Figure 16:
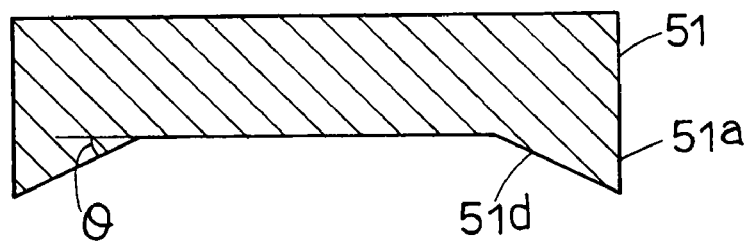
FIG. 16 is a sectional view showing main part of another partial wafer removing pressing jig employed in the manufacturing method of the bonding substrate according to the first embodiment of the present invention.
Figure 17:
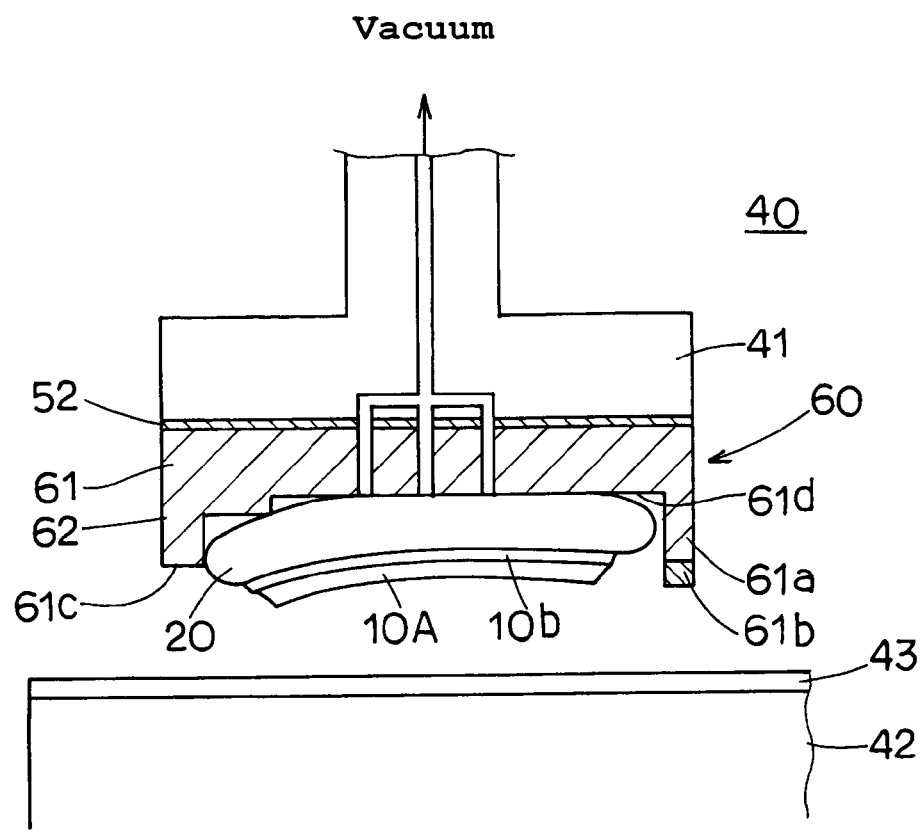
FIG. 17 is a sectional view showing a process for mounting a bonding wafer to a partial wafer removing pressing jig for a wafer with an orientation flat employed in the manufacturing method of the bonding substrate according to a second embodiment of the present invention.
Figure 18:
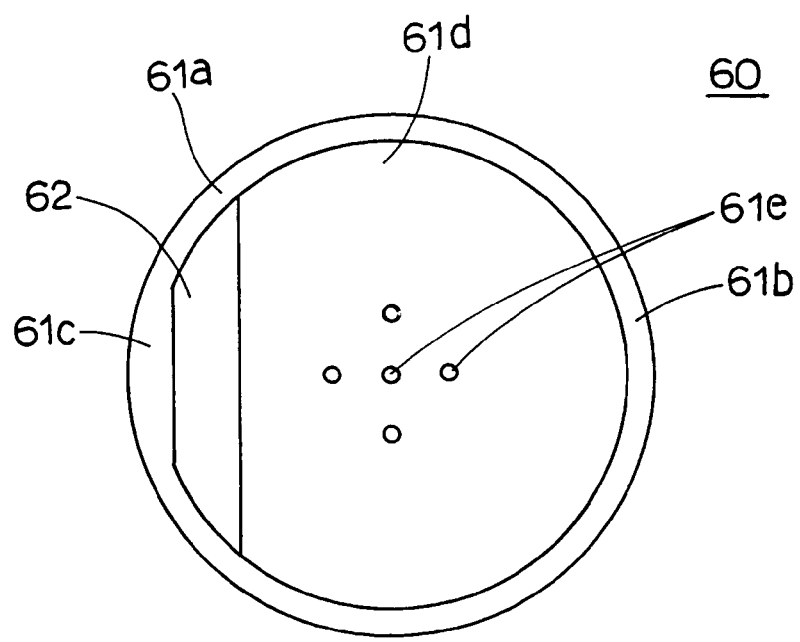
FIG. 18 is a bottom view of the partial wafer removing pressing jig according to the second embodiment of the present invention.

FIG. 15 and FIG. 16 show the angle of inclination, θ, of the tapered plane 51*d* of the protruding ridge section 51*a* in the wafer periphery pressing jigs 50 and 50A-50E. Among those, FIG. 15 shows the angle of inclination, θ, of the tapered plane 51*d* of the type employed in the wafer periphery pressing jig 50, 50A, 50C, and 50D. Further, FIG. 16 shows the angle of inclination, θ, of the tapered plane 51*d* of the type employed in the wafer periphery pressing jig 50B and 50E.

A second embodiment of the present invention will now be described with reference to FIG. 17 through FIG. 22.

The feature of the second embodiment resides in a point that after the periphery removing polishing in the first embodiment, a partial periphery removing polishing process is applied, in which only a portion in the circumferential direction of the peripheral region of the bonding wafer 30 is polished again (i.e., the second polishing) so as to remove the active layer 10A in that portion.

Figure 19:
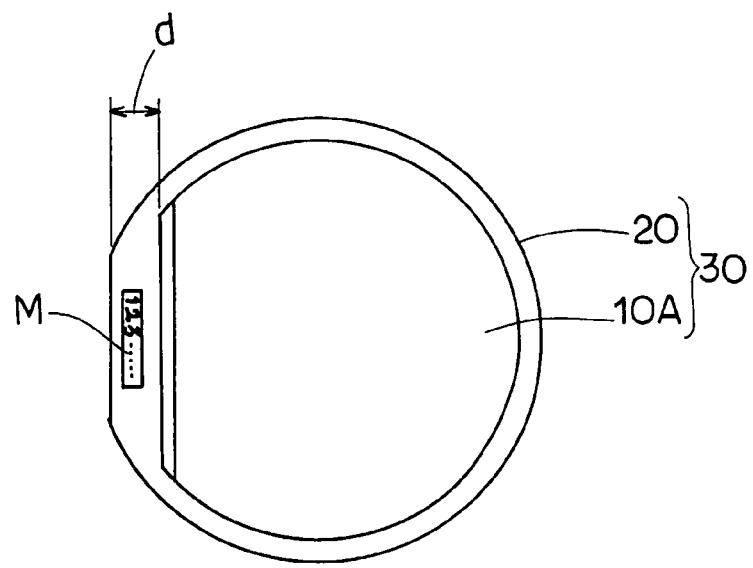
FIG. 19 is a plan view of a bonding wafer fabricated by using the partial wafer removing pressing jig according to the second embodiment of the present invention.

A specified portion of the bonding wafer 30 subject to the second polishing is the portion in the vicinity of the orientation flat. By applying such a partial periphery removing polishing, a width, d, of a terraced section in the vicinity of the orientation flat of the supporting substrate wafer 20 is extended, and the hard laser mark, M, may be printed on that extended terraced section (FIG. 19). For partial periphery removing polishing, a partial wafer removing pressing jig 60 is used.

In this regard, the partial wafer removing pressing jig 60 will be described in detail.

The partial wafer removing pressing jig 60 comprises a jig body 61, and a partial protruding section 62 which is formed integrally with the jig body 61 on a surface thereof for supporting the bonding wafer 30 and serves to protrude only a portion desired to be removed of the peripheral region of the active layer 10A toward a polishing surface side.

The jig body 61 is made of rigid material, such as PEEK, and has a thick disk-like shape. A top surface of the jig body 61 is affixed with one of the faces of the double-sided tape 52. An annular protruding ridge section 61*a* is integrally formed with the jig body 61 on a lower surface of a peripheral region thereof. In this configuration, an under surface of the peripheral region of the jig body 61 except a portion located in the vicinity of the orientation flat is securely bonded with an anti-wear frame 61*b* made of ceramic having generally a C-shape. Further, an orientation flat guide 61*c* is formed integrally with the protruding ridge section 61*a* in a portion thereof facing to the orientation flat of the bonding wafer 30, by thickening said portion to thereby guide the orientation flat portion of the bonding wafer 30 from outside thereof. Herein, a region located in an inner side of the protruding ridge section 61*a* forms a pressing section for pressing an entire area of the central region of the bonding wafer 30 from a back surface. Size of this region, or the size of a pressing surface 61*d* against the bonding wafer 30, is specified to be sufficient for applying the partial periphery removing polishing to the wafer by an amount in the order of 4 mm in the orientation flat portion for the bonding wafer 30 having a diameter of 200 mm. A partial protruding section 62 is formed integrally with the pressing surface 61*d* in a portion corresponding to that of the orientation flat of the wafer such that the width of the terraced section, d, of the supporting substrate wafer 20 may be extended to 4 mm. The partial protruding section 62 is a 0.2 mm high flat raised portion formed adjacently to the orientation flat guide 61*c*. When the bonding wafer 30 is vacuum sucked onto the pressing surface 61*d*, the orientation flat portion of the bonding wafer 30 is deformed by the partial protruding section 62 so as to be protruded more toward the polishing surface side than the central region of the active layer wafer 10, ultimately protruding slightly beyond the lower end face of the protruding ridge section 61*a*. Five pieces of spaced suction ports 61*e*. . . are formed in a central region of the pressing surface 61*d*, which are in communication with an air suction section of a vacuum generator (not shown).

During the partial periphery removing polishing process, the polishing head 41 is driven at a revolving speed of 60 rpm and the polishing platen 42 is driven at a revolving speed of 60 rpm. During this process, the polishing pressure of the active layer wafer 10 against the polishing cloth 43 applied via the partial wafer removing pressing jig 60 is in the order of 0 kg/cm$^2$ for the central region of the active layer wafer 10 and in the order of 500 kg/cm$^2$ for the orientation flat portion of the same. This results in the polishing rate of the order of 5 to 10 μm/minute for the orientation flat portion and the polishing rate of the order of 0 μm/minute for the wafer central region. The amount to be polished off is in the order of 0 μm for the central region of the active layer wafer 10 and in the order of 20 μm for the wafer peripheral region, which causes the active layer wafer 10 to be removed in the orientation flat portion by the width d (4 mm). The supply amount of the polishing agent containing abrasive grains (colloidal silica) is at a rate of 1800 ml/minute.

As described above, since in the present invention, the partial periphery removing polishing is carried out, one part of the wafer peripheral region of the active layer 10A in the vicinity of the orientation flat is removed in a large extent to form a wide section in the inclined plane of the wafer peripheral region. Owing to this, even if the laser marking M is applied to said wide section, the effect of the irradiated laser would not easily reach the active layer 10A. As a result, the generation of the dust particles in the active layer 10A during the laser marking can be inhibited.

Other configuration, operation and effect of the partial wafer removing pressing jig 60 is substantially the same as those of the wafer periphery pressing jig 50 of the first embodiment described above, and the explanation thereof should be herein omitted.

Figure 20:
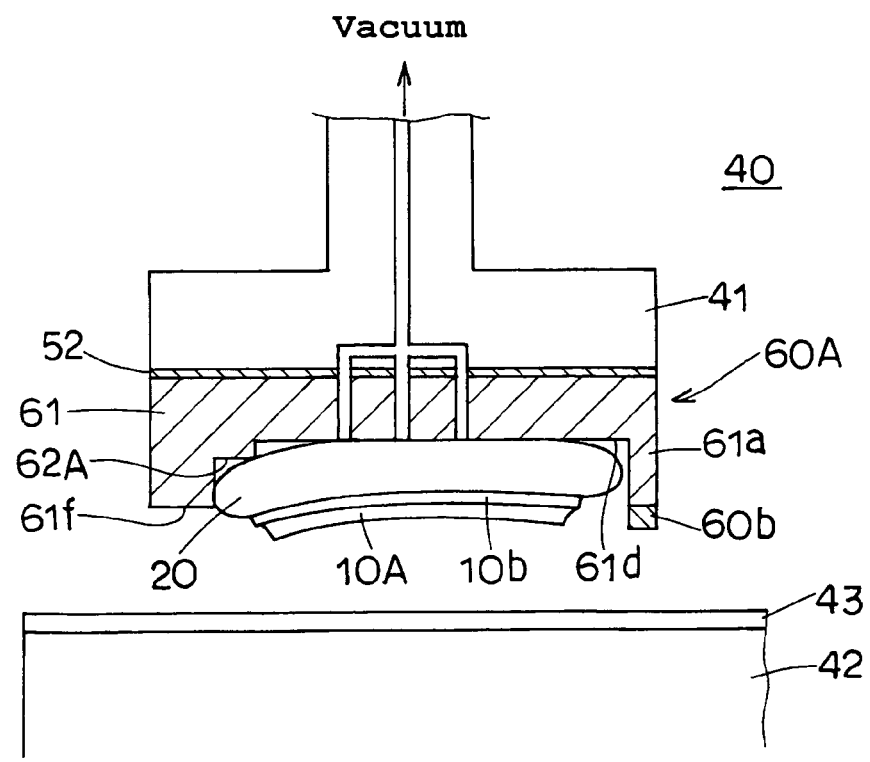
FIG. 20 is a sectional view showing a process of mounting a bonding wafer to a partial wafer removing polishing jig employed in a manufacturing method of a bonding substrate according to another alternative embodiment of the present invention.
Figure 21:
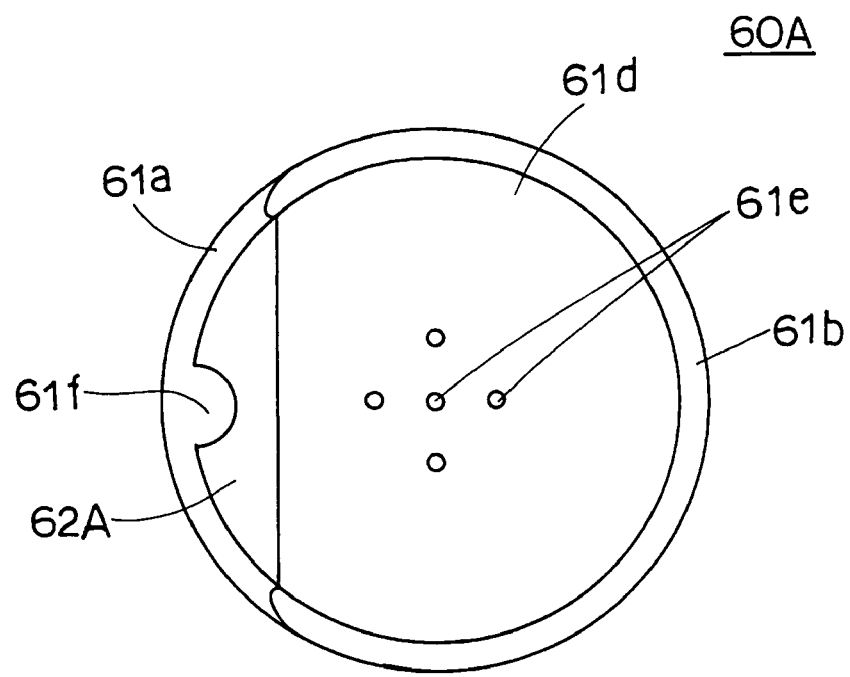
FIG. 21 is a plan view of a partial wafer removing pressing jig employed in a manufacturing method of a bonding substrate according to said another alternative embodiment of the present invention.
Figure 22:
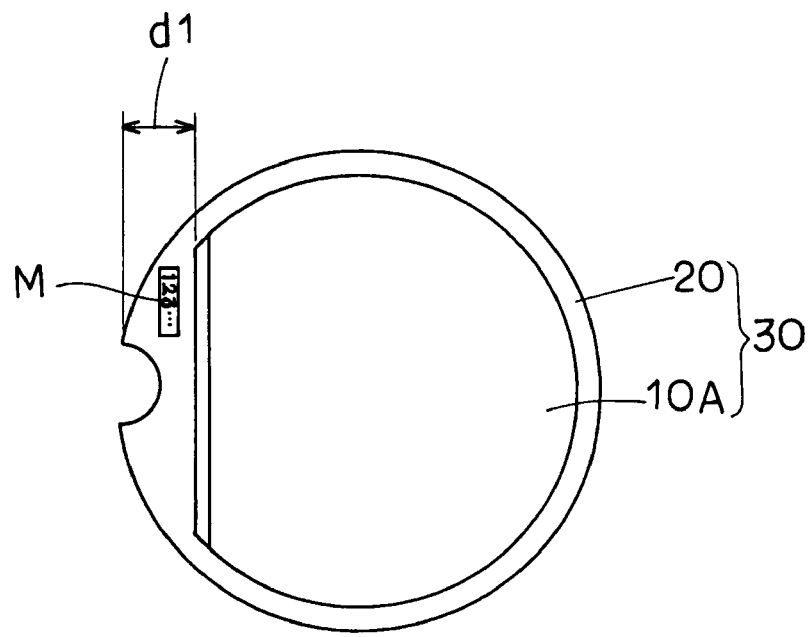
FIG. 22 is a plan view of a bonding wafer fabricated by using the partial wafer removing pressing jig according to said another alternative embodiment of the present invention.
Figure 23:
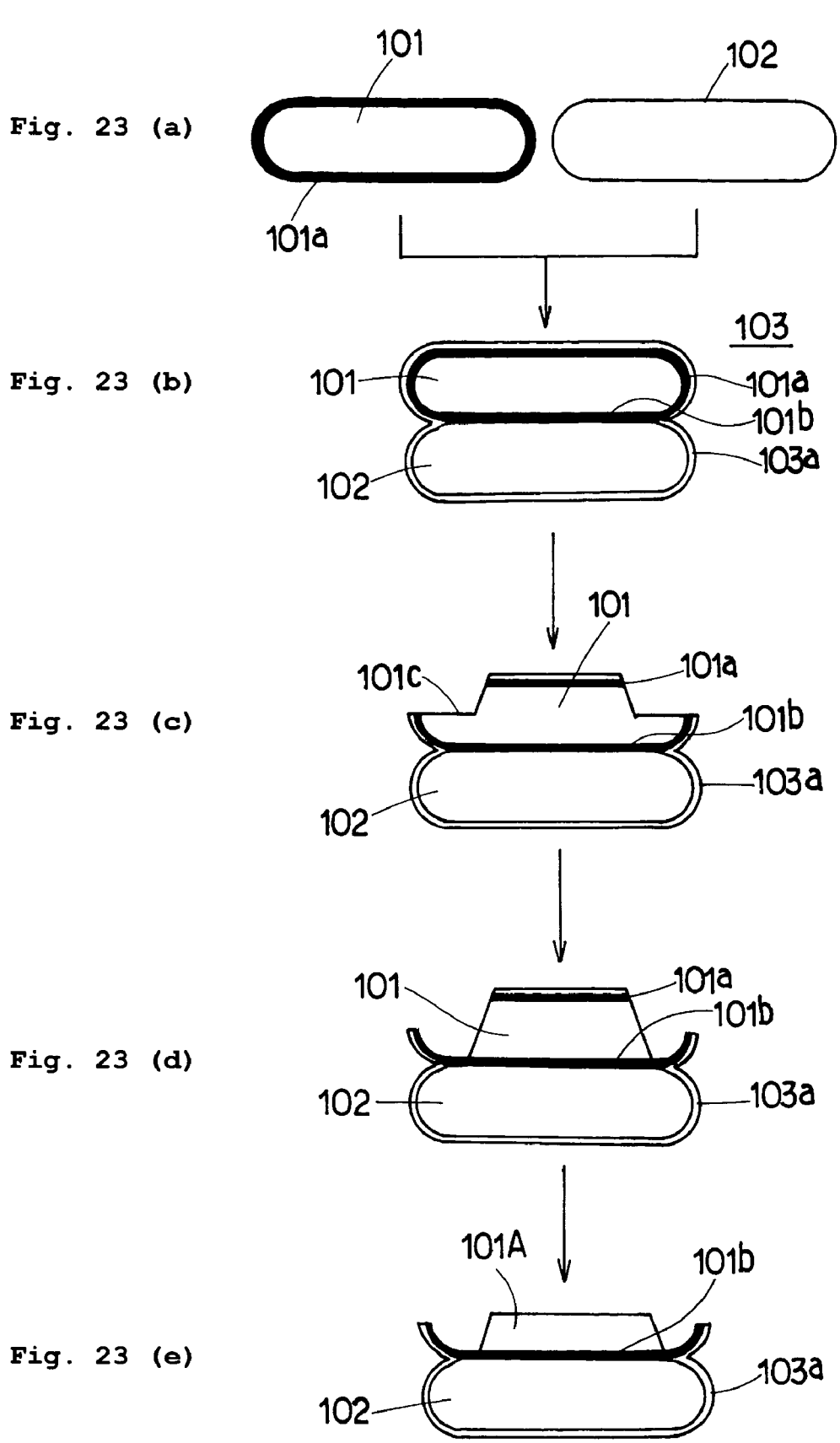
FIG. 23 is a flow chart showing a manufacturing method of a bonding substrate according to a conventional means.
Figure 24:
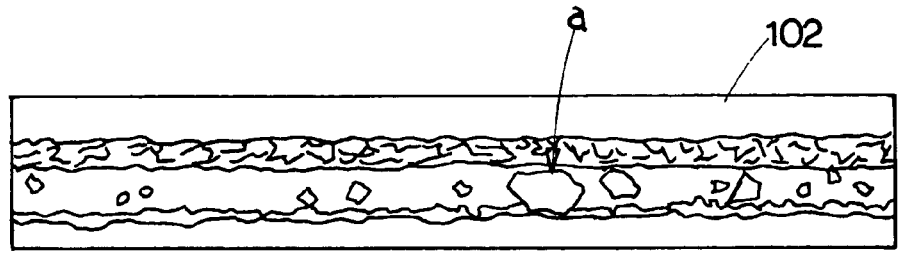
FIG. 24 is an enlarged front elevation view of an etch pit developed in a peripheral end face of a supporting substrate wafer according to the conventional means.
Figure 25:
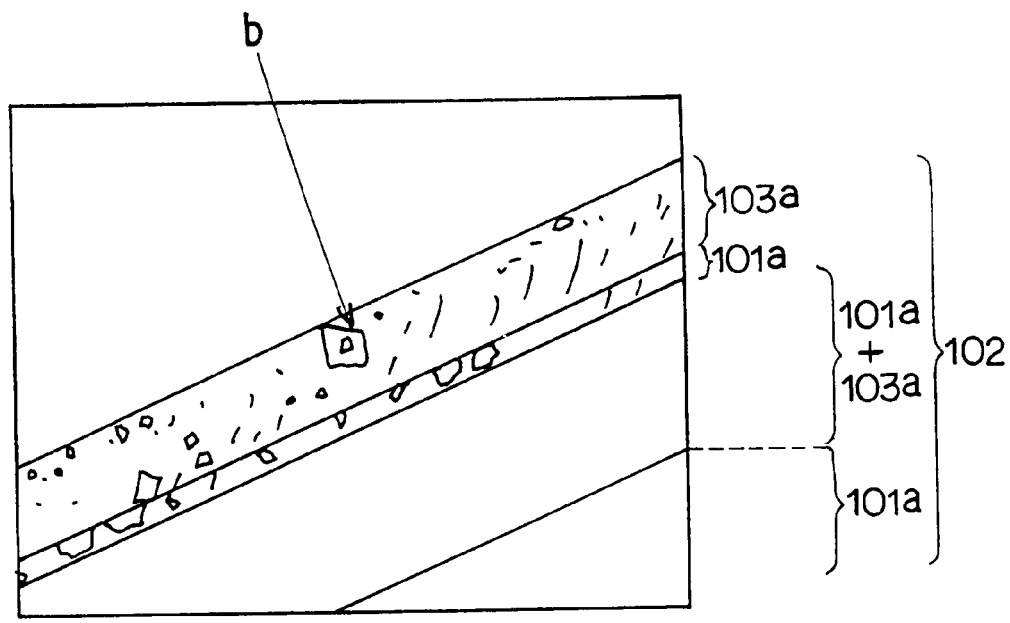
FIG. 25 is an enlarged plan view of an etch pit developed in a terraced section of a supporting substrate wafer according to the conventional means.
Figure 26:
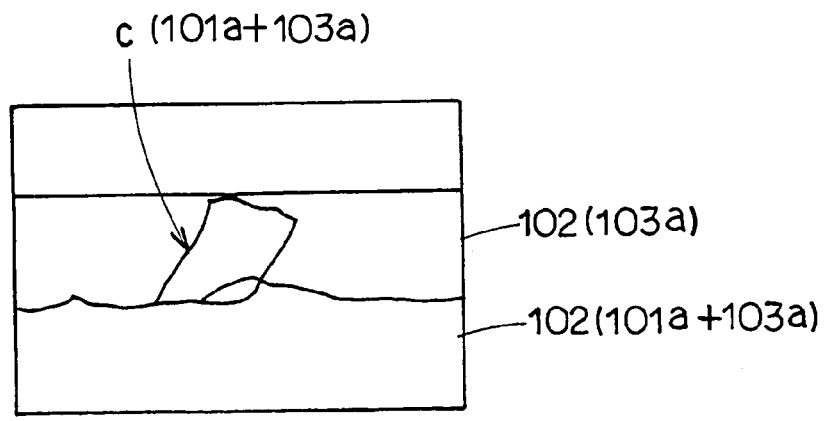
FIG. 26 is an enlarged front elevation view of a portion left un-ground-off of a silicon oxide film developed in a peripheral region of a supporting substrate wafer according to the conventional means.
Figure 27:
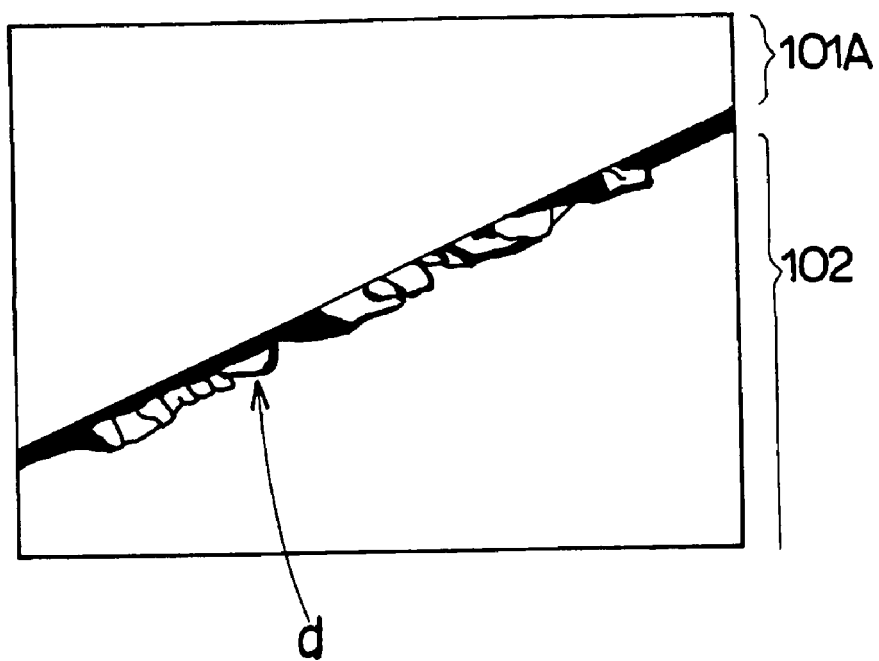
FIG. 27 is an enlarged plan view of an indent developed in a part of the peripheral edge face of an active layer according to the conventional means.

FIG. 20 through FIG. 22 show an example of a partial wafer removing polishing jig designated generally by reference numeral 60A, which is configured to apply the partial periphery removing polishing to the bonding wafer 30 having a notch. A notch guide 61f for guiding the notch portion of the bonding wafer 30 from outside is formed integrally with the protruding ridge section 61a in its portion facing to the notch of the wafer by making this portion thicker into half-moon shape in a bottom view. In addition, a partial protruding section 62A for extending the width, d1, of the terraced section of the supporting substrate wafer 20 to 4 mm is formed integrally with the pressing surface 61d in its notch portion. The partial protruding section 62A is a 0.2 mm high flat raised portion formed adjacent to the notch guide 61f. Other configuration, operation and effect of the partial wafer removing polishing jig 60A are substantially the same as the wafer periphery pressing jig 50 of the first embodiment described above.

Although no illustration in the drawings, the bonding wafer may be clamped within the wafer periphery pressing jig or the partial wafer removing pressing jig in order to reduce a play of the bonding wafer in the wafer periphery pressing jig or the partial wafer removing pressing jig.

Further, in the above embodiments, the description has been provided by taking as an example the bonding SOI substrate that may be fabricated by bonding the active layer wafer and the supporting substrate wafer in one on the other and then reducing the thickness of the active layer wafer through the surface grinding or the like to form the active layer. However, the present invention is not limited to this, but can be applied to the bonding substrate fabricated by, for example, the smart cut method. Furthermore, the present invention can be applied also to the bonding substrate fabricated by the ELTRAN method or the SiGen method.

In these cases, during fabrication of the bonding substrate by the smart cut method, the ELTRAN method or the SiGen method, after having bonded the active layer wafer with the supporting substrate wafer, the active layer wafer is removed with a portion defined in the bonding side left on the supporting substrate wafer to thereby form the active layer on one surface of the supporting substrate wafer. Subsequently, the polishing is to be applied to the active layer from the removing surface side thereof to remove the peripheral region but leave the central region thereof (i.e., periphery removing polishing). Further, the present invention may be appropriately applied for polishing the peripheral region of not only the bonding wafers but also a variety of substrates.

As described above, according to the present invention, since the periphery removing polishing has been employed as the polishing process subsequent to the surface grinding, in which the defective bonding portion in the peripheral region of the active layer wafer is removed with the central region thereof left un-removed, therefore the periphery grinding of the active layer wafer and the periphery etching of the active layer, which have been required in the prior art, can be eliminated. Owing to this, the number of manufacturing processes of the bonding substrate can be reduced and the manufacturing time of the bonding substrate can also be reduced.

Further, applying the periphery removing polishing may help prevent an etch pit from being developed in the peripheral surface of the supporting substrate wafer, which could be caused by the periphery etching, and it may also prevent a contamination and/or a scratching from being produced in the active layer, which could be caused by a silicon oxide film portion left un-ground-off in the peripheral region of the active layer. This may enhance a production efficiency of non-defective units of the bonding substrate. As a result, a manufacturing cost of the bonding substrate may be reduced. Further, such a bonding substrate containing an active layer with a notch formed therein may be fabricated in a simple manner, which has been considered difficult to fabricate according to the conventional method.

Furthermore, since the alkaline etchant is no more used, an indent resultant from the anisotropic etching would not be generated in a region of the outer circumferential edge surface of the active layer, even in a region having uneven crystal orientation. Owing to this, the peripheral edge surface of the active layer can be formed into smooth surface over an entire circumference thereof.

In addition, since the wafer periphery pressing jig is used to apply the periphery removing polishing, even an existing polishing apparatus still can carry out the periphery removing polishing process of the present invention in an easy manner.

Further, if after the periphery removing polishing, the partial wafer removing pressing jig is used to apply the peripheral region removing polishing, a certain portion of the active layer is removed in a large extent specifically in a certain area in the circumferential direction of the peripheral region of the wafer, for example, in the area of the orientation flat portion or the notch portion, so as for these areas to be formed into a wider portion of inclined plane. Owing to this, even if such a wider portion is applied with the laser marking, the effect of the irradiated laser would not easily reach the active layer. As a result, the generation of the dust particles in the active layer during the laser marking can be inhibited.

Further, the bonding wafer can be fabricated without causing any peripheral region of the wafer to be stripped even without applying the thermal processing for enhancing the bonding strength after bonding the active layer wafer and the supporting substrate wafer under a room temperature, by applying the surface grinding to the active layer wafer and also applying the periphery removing polishing to the peripheral region of the active layer. As a result, when the thermal processing is applied in the reducing atmosphere or in the inactive atmosphere after the central region of the active layer has been polished, the crystal defect can be removed from the surface of the active layer even if the thermal processing in the above atmosphere is not applied separately from the bonding thermal processing. It means that the surface of the active layer can be made a defect-free surface.

EFFECT OF THE INVENTION

As described above, the bonding substrate, the manufacturing method thereof and the wafer periphery pressing jigs used in the same method are useful for the bonding substrate comprising the active layer bonded with the supporting substrate wafer, the bonding substrate having the SOI structure, or the bonding substrate fabricated by the smart cut method, the ELTRAN method or the SiGen method.

What is claimed is:

1. A manufacturing method of a bonding substrate, comprising:
   a bonding step for bonding an active layer wafer and a supporting substrate wafer in one on the other;
   a thermal processing step for enhancing a bonding strength of said bonding wafer fabricated in said bonding step;
   a surface grinding step for applying a surface grinding to the active layer wafer side of said bonding wafer to decrease a thickness of said active layer wafer so as to make it operative as an active layer; and
   a polishing step for polishing and removing said active layer between a peripheral edge of said active layer and a peripheral region of a bonding interface formed in said bonding step;
   wherein in said polishing step a polishing pressure applied onto the peripheral region of said active layer is controlled to be higher than that onto the central region thereof.

2. A manufacturing method of a bonding substrate in accordance with claim 1, in which said polishing step is executed by using a wafer periphery pressing jig which deforms the peripheral region of said active layer so as to be protruded more toward a polishing surface side than the central region thereof.

3. A manufacturing method of a bonding substrate in accordance with claim 1, further comprising, after said polishing step, a partial periphery removing polishing step for polishing again exclusively a portion of said bonding wafer defined in a circumferential direction in said peripheral region so as to remove the active layer in said portion.

4. A manufacturing method of a bonding substrate in accordance with claim 3, in which said partial periphery removing polishing step is executed by using a partial wafer removing pressing jig which deforms only a portion desired to be removed in the peripheral region of said active layer so as to be protruded toward a polishing surface side.

5. A manufacturing method of a bonding substrate in accordance with claim 2, further comprising, after said polishing step, a partial periphery removing polishing step for polishing again exclusively a portion of said bonding wafer defined in a circumferential direction in said peripheral region so as to remove the active layer in said portion.

6. A manufacturing method of a bonding substrate, comprising:
   a bonding step for bonding an active layer wafer and a supporting substrate wafer in one on the other;
   a surface grinding step for applying a surface grinding to the active layer wafer side of said bonding wafer to decrease a thickness of said active layer wafer so as to make it operative as an active layer;
   a polishing step for polishing and removing a peripheral part of said active lever between a peripheral edge of said active layer and a peripheral region of a bonding interface formed in said bonding step;
   after said polishing step for polishing and removing said peripheral region, a central polishing step for polishing a central region of said active layer; and
   after said central polishing step, a thermal processing step for applying a thermal processing in a reducing atmosphere or in an inactive atmosphere to said bonding wafer thereby to enhance the bonding strength of said bonding wafer while removing a crystal defect from the surface of said active layer.

7. A manufacturing method of a bonding substrate in accordance with claim 6, in which a polishing rate in the peripheral region of said active layer is controlled to be higher than that in the central region thereof.

8. A manufacturing method of a bonding substrate in accordance with claim 7, in which a polishing pressure applied onto the peripheral region of said active layer is controlled to be higher than that onto the central region thereof.

9. A manufacturing method of a bonding substrate in accordance with claim 8, in which said periphery removing polishing step is executed by using a wafer periphery pressing jig which deforms the peripheral region of said active layer so as to be protruded more toward a polishing surface side than the central region thereof.

* * * * *